(12) United States Patent
Nakata

(10) Patent No.: US 8,686,280 B2
(45) Date of Patent: Apr. 1, 2014

(54) SEE-THROUGH TYPE SOLAR BATTERY MODULE

(75) Inventor: Josuke Nakata, Kyoto (JP)

(73) Assignee: Kyosemi Corporation, Kyoto (JP)

( * ) Notice: Subject to any disclaimer, the term of this patent is extended or adjusted under 35 U.S.C. 154(b) by 478 days.

(21) Appl. No.: 12/737,639

(22) PCT Filed: Aug. 8, 2008

(86) PCT No.: PCT/JP2008/002173
§ 371 (c)(1),
(2), (4) Date: Feb. 1, 2011

(87) PCT Pub. No.: WO2010/016098
PCT Pub. Date: Feb. 11, 2010

(65) Prior Publication Data
US 2011/0132435 A1    Jun. 9, 2011

(51) Int. Cl.
*H01L 31/042* (2006.01)
*H01L 31/05* (2006.01)
*H01L 31/048* (2006.01)
*H01L 31/0352* (2006.01)

(52) U.S. Cl.
USPC ............ 136/250; 136/244; 136/249; 136/251

(58) Field of Classification Search
USPC .................................................. 136/243–265
See application file for complete search history.

(56) References Cited

U.S. PATENT DOCUMENTS 4,173,494 A * 11/1979 Johnson et al. ............... 136/250
4,567,316 A * 1/1986 Hollaus et al. ................ 136/246
5,059,254 A * 10/1991 Yaba et al. .................... 136/251
5,616,185 A * 4/1997 Kukulka ........................ 136/244
6,204,545 B1 * 3/2001 Nakata .......................... 257/459
6,288,323 B1 * 9/2001 Hayashi et al. ............... 136/244
6,635,507 B1 * 10/2003 Boutros et al. .................. 438/57
6,744,073 B1   6/2004 Nakata (Continued)

FOREIGN PATENT DOCUMENTS

JP        2007-073898     3/2007
WO     WO-98/15983     4/1998

(Continued)

OTHER PUBLICATIONS

Glassolutions. "Ceramic Printed Glass" Copyright 2005, pulled from Feb. 25, 2006. http://www.aisglass.com/bent_tempered.asp.*

*Primary Examiner* — Alicia Bland
*Assistant Examiner* — Liesl C Baumann
(74) *Attorney, Agent, or Firm* — Jordan and Hamburg LLP

(57) ABSTRACT

A see-through type solar battery module includes optically transparent first and second substrates and a plurality of annular clusters. Each cluster includes: a plurality of spherical solar cells; a conductive layer to which first electrodes of the plurality of solar cells are electrically connected in parallel; a conductive member to which second electrodes of the plurality of solar cells are electrically connected in parallel; a bypass diode connected to the conductive layer and the conductive member; and a conductive connection member that electrically connects the conductive layer to conductive member of the cluster that is adjacent in a predetermined direction. By providing the clusters in a snowflake configuration, or in a single rectilinear pattern, the scope is enlarged for selecting the ratio between sunlight transmission ratio and electrical generation capability, so that enhanced freedom of design for use as a window material is obtained.

14 Claims, 19 Drawing Sheets

(56) References Cited

U.S. PATENT DOCUMENTS

| | | | |
|---|---|---|---|
| 7,238,878 B2 * | 7/2007 | Gonsiorawski | 136/246 |
| 7,244,998 B2 * | 7/2007 | Nakata | 257/461 |
| 7,602,035 B2 | 10/2009 | Nakata | |
| 2005/0127379 A1 | 6/2005 | Nakata | |
| 2006/0037640 A1 * | 2/2006 | Miura | 136/246 |
| 2010/0219423 A1 | 9/2010 | Nakata | |
| 2012/0222724 A1 * | 9/2012 | Nakata | 136/250 |

FOREIGN PATENT DOCUMENTS

| | | |
|---|---|---|
| WO | WO-02/35612 | 5/2002 |
| WO | WO-03/036731 | 5/2003 |
| WO | WO-2007/080631 | 7/2007 |

* cited by examiner

SEE-THROUGH TYPE SOLAR BATTERY MODULE

TECHNICAL FIELD

The present invention relates to a see-through type solar battery module, and in particular relates to a see-through type solar battery module in which a plurality of clusters are formed with each cluster including a plurality of spherical solar cells, these clusters are arranged in various patterns including a pattern such as a matrix having a plurality of rows and a plurality of columns, and these clusters are integrally installed to a pair of optically transparent substrates.

BACKGROUND TECHNOLOGY

In the prior art, various solar battery modules and solar battery panels have been implemented in practice that incorporate solar cells installed in a window material capable of transmitting sunlight. Generally, these are silicon type solar battery modules (or panels) that are made by laying flat plate shaped silicon solar cells that are manufactured from wafer shaped silicon crystals between two glass plates. Such a module is an adhered structure that is made by lining up the solar cells in a planar configuration with appropriate gaps being left between them and electrically connecting the cells by ribbon shaped conductors, and then by embedding them using an EVA (ethylene vinyl acetate) resin in the gap between the two glass plates.

Furthermore, there is a thin layer type of solar battery module in which are made from amorphous silicon and microcrystalline material. In order to manufacture such module as a window material, first, a transparent electrode layer of TCO ($SnO_2$) is formed on a glass board substrate, and is separated into sections by laser light for making cell electrode portions. Next, a thin silicon layer, amorphous silicon (a-Si), and a thin silicon microcrystal layer are sequentially laminated thereupon, and this photoelectric layer is separated into sections at a constant pitch by laser light. Furthermore, a thin metallic layer is adhered over the entire area of the rear surface as an electrode, and, again with laser light, this metallic layer is separated into mutually insulated portions, so that a large number of small thin-layer solar cells are electrically connected in series at one time.

With these solar battery modules described above, only one side of the solar cells can serve as a light reception surface, and the electricity generation capability is low because the usable range of the ambient light around the module is narrow. Furthermore, with a silicon type solar battery module, the sunlight transmission ratio (see-through ratio) become small due to the flat plate type solar cells of large size. Moreover, with a thin layer type solar battery module, manufacturing the thin layers on the glass substrates is accompanied by many difficulties.

Thus, in consideration of the above problems, the inventor of the present application has proposed a spherical solar cell as described in Patent Document #1. This spherical solar cell consists of a p type or n type spherical semiconductor of diameter 1 to 2 mm, a pn junction formed in the vicinity of the spherical surface of the semiconductor, a pair of small positive and negative electrodes provided at opposite ends of the surface of the spherical semiconductor so as to oppose one another with its center interposed between them. As compared to the silicon type solar cell or the thin layer type solar cell described above, this spherical solar cell is compact, and can be manufactured easily at a low price.

Since the surface of the spherical solar cell is a spherical surface, its technical advantages become remarkable in an environment in which there is a lot of reflected light or scattered light as well as the directly incident light. For example, if it is embedded in a transparent package, reflected light and scattered light in the interior can contribute to electricity generation; and, if a solar battery module that is combined with a window is installed vertically on a building such as an office building or the like, then it can generate electricity due to absorption of reflected light from the ground surface or the surroundings of the building or the like.

Although the incident direction of the direct incident light from the sun changes along with time as the angle of incidence changes, since the light reception surface is shaped to be spherical, it is still possible to anticipate comparatively stable generation of electricity without dependence on the incident direction, as compared with solar cell of a planar type.

Furthermore, as described in Patent Documents #2 and #3, the inventor of the present application has proposed a see-through type solar battery module, in which spherical cells as described above are arranged in a matrix configuration having a plurality of rows and a plurality of columns, are connected in parallel and in series by thin flexible lead wiring or printed wiring, and are molded in transparent resin between a pair of transparent case plates.

Patent Document #1: International Publication WO 98/15983.

Patent Document #2: International Publication WO 03/36731.

Patent Document #3: International Publication WO 2007/80631.

DISCLOSURE OF THE INVENTION

Problems to be Solved by the Invention

However, since the plurality of spherical solar cells described in Patent Documents #1 through #3 mentioned above are arranged approximately rectilinearly and in a close together state, there is a problem with regard to enhancement of the freedom of design. For example, in the case of a window material in which a spherical solar battery module as described above is installed, since the solar cells are arranged in a close together state, problems arise such as that the freedom of design for appropriately setting the sunlight transmission ratio (see-through ratio) as a window material and the electrical generation capability as a solar battery module is restricted, that it is impossible to enhance the freedom of design because the see-through performance is undesirably obstructed by the solar cells.

Objects of the present invention are to provide a see-through type solar battery module that can enhance the freedom of design when used as a window material, and to provide a see-through type solar battery module that can increase the sunlight transmission ratio when used as a window material, and so on.

Means to Solve the Problem

The present invention presents a see-through type solar battery module for generating electricity with a plurality of spherical solar cells, and is characterized by comprising: an optically transparent first substrate; a plurality of spherical solar cells arranged with their conductive directions orthogonal to the first substrate and grouped into a plurality of clusters; a plurality of conductive layers formed on an inner surface of the first substrate so as to correspond to the plurality of clusters, with first electrodes of the plurality of solar cells of each cluster connected electrically in parallel thereto respectively; a plurality of conductive members each of which is connected electrically in parallel to second electrodes of the plurality of solar cells of each cluster; a plurality of conductive connection members each of which electrically connects the conductive layer of each cluster to the conductive member of an adjacent cluster in a predetermined direction; a second optically transparent substrate disposed parallel to the first substrate with the plurality of solar cells sandwiched between them; and an optically transparent synthetic resin molding material that is charged between the first and second substrates and embeds the plurality of solar cells, the plurality of conductive members, and the plurality of conductive connection members therein.

Advantages of the Invention

According to the see-through type solar battery module of the present invention, since each of the plurality of clusters includes a plurality of the spherical cells, therefore each cluster can form the cell arrangement pattern freely. Due to this, it is possible to enhance the freedom of design for use as a window material. And, since a plurality of these clusters are provided and can be arranged, it is possible to impart a desired pattern of the arrangement to the solar battery module, so that it is possible further to enhance the freedom of design. Moreover it is possible to ensure good sunlight transmission even when the spherical solar cells are used in a window material, since they are extremely small.

In addition to the above described structure of the present invention, it would also be acceptable to employ, in addition, various structures such as the following.

(1) A positive terminal of the see-through type solar battery module may be provided at one end portion of the first substrate, and a negative terminal of the see-through type solar battery module may be provided at another end portion of the first substrate.

(2) Each of the solar cells may comprise: a p type or n type spherical semiconductor; a pn junction formed at a spherical surface layer portion of the spherical semiconductor; and a pair of electrodes that are formed so as to oppose one another on opposite sides of the center of the spherical semiconductor and are electrically connected to both sides of the pn junction.

(3) A plurality of bypass diodes may be provided corresponding to the plurality of clusters, each of which is connected to the conductive layer and the conductive member.

(4) The solar cells may have a bypass function of bypassing reverse current.

(5) The conductive connection member may have an elongated conductive layer portion elongated from the conductive layer, and a conductive connecting piece that is electrically connected to an end portion of the elongated conductive layer portion; and the plurality of solar cells, the conductive connecting piece, and the bypass diode in each cluster may be disposed in an annulus, and the plurality of clusters may be arranged in a matrix configuration having a plurality of rows and a plurality of columns.

(6) The plurality of solar cells grouped into plural clusters of each row or each column may be electrically connected in series via the conductive connection members, and conductive layer bridges may be provided that electrically connect a plurality of conductive layers in each of the plurality of columns or each of the plurality of rows.

(7) The plurality of solar cells in each cluster may include six solar cells arranged at the vertices of an inner hexagon shape and five solar cells arranged at the vertices of an outer hexagon shape that is outside the inner hexagon shape.

(8) The conductive connection member may include an elongated conductive layer portion elongated from the conductive layer and a conductive connecting piece that is electrically connected to an end portion of the elongated conductive layer portion, and the conductive connecting piece may be disposed at a vertex of the outer hexagon shape; and the bypass diode may be disposed at the central portion of the inner hexagon shape.

(9) The plurality of clusters may be arranged in a plurality of rows and a plurality of columns, so that the central portions of the inner hexagon shapes are positioned at the mesh points of a mesh of equilateral triangles.

(10) Conductive layer bridges may be provided that electrically connect the plurality of conductive layers of the plurality of clusters in zigzag lines in a direction that is orthogonal to the row direction or the column direction of the plurality of rows and the plurality of columns.

(11) The plurality of solar cells in each cluster may be arranged on one straight line.

(12) The first and second substrates may be made from transparent glass plates.

(13) The proportion occupied in the entire area by the light transmission region in which sunlight is not intercepted by the conductive layers may be greater than or equal to 50%.

(14) A plurality of the see-through type solar battery modules may be arranged in a plurality of rows or in a plurality of columns by being fitted into an external surrounding frame made from metal.

(15) A ceramic layer, with added color and patterned, may be provided as a foundation for the plurality of conductive layers.

Figure 1:
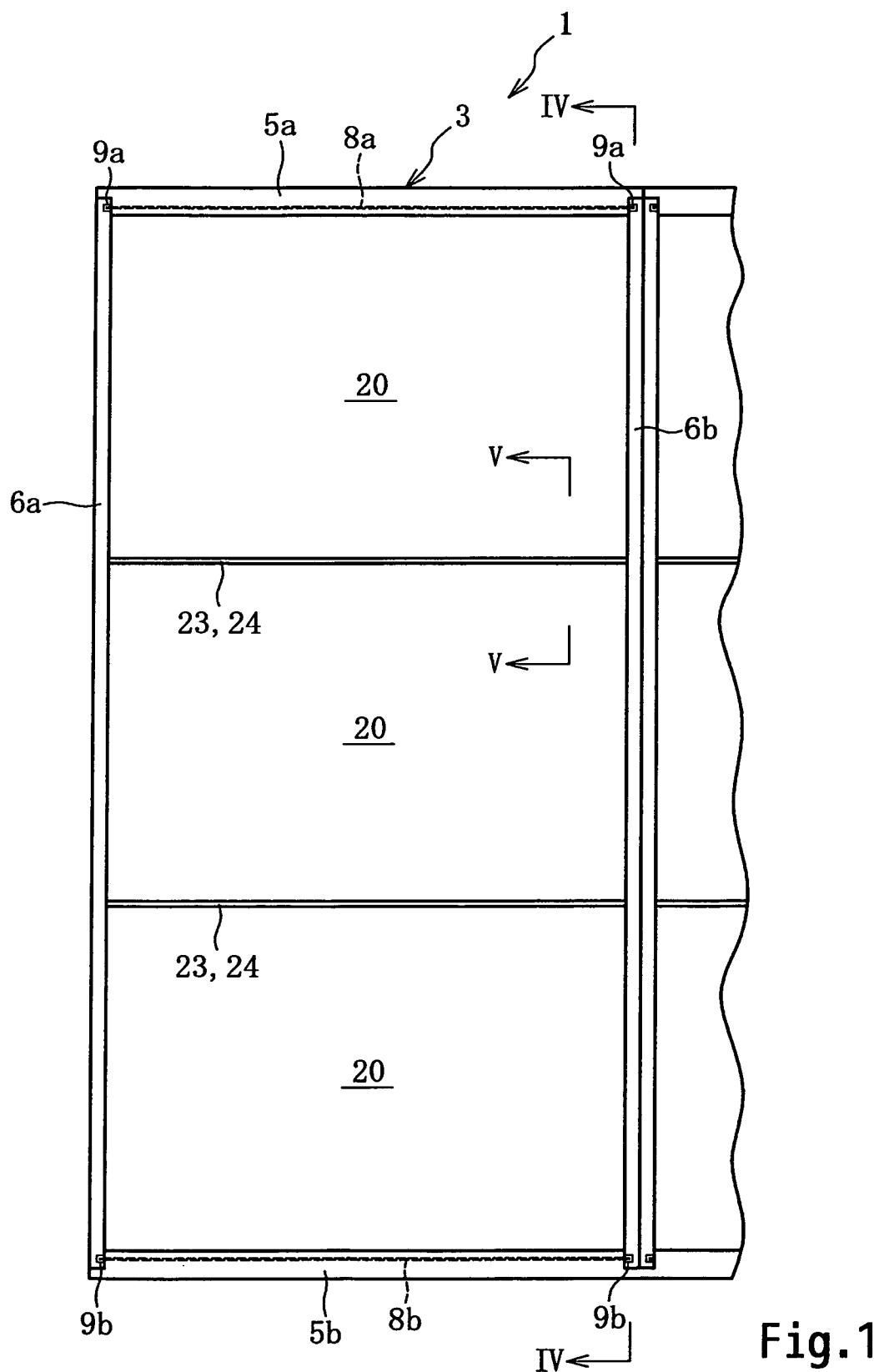
FIG. 1 is a rear view of a solar battery panel to which see-through type solar battery modules according to a first embodiment of the present invention are installed.
Figure 2:
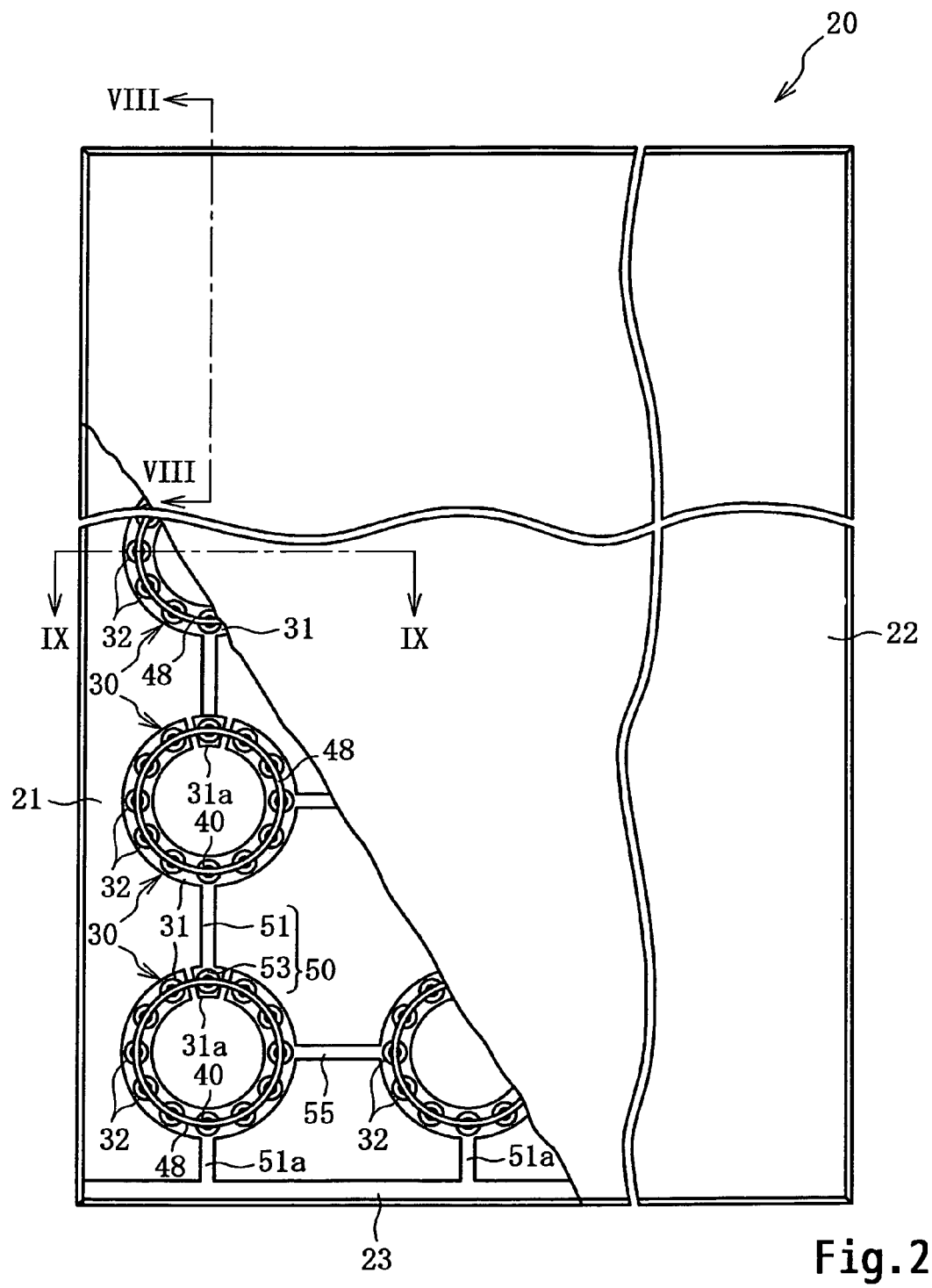
FIG. 2 is a partially cut away elevation view of the see-through type solar battery modules.
Figure 3:
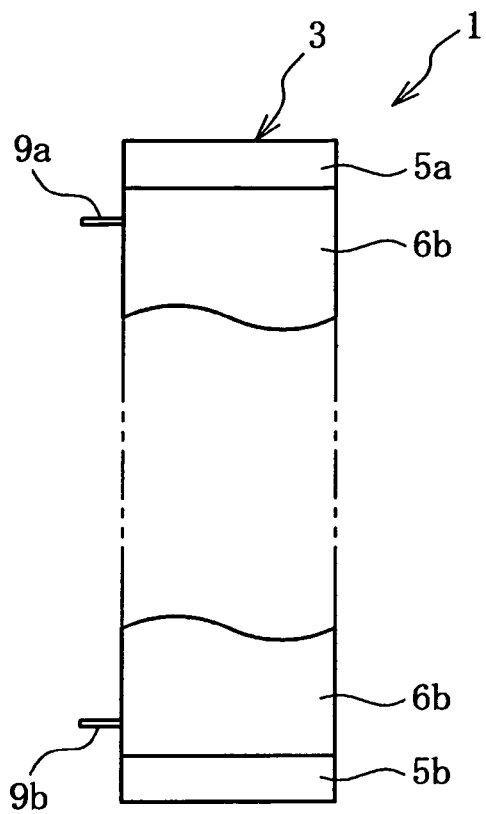
FIG. 3 is a side view of the solar battery panel.
Figure 4:
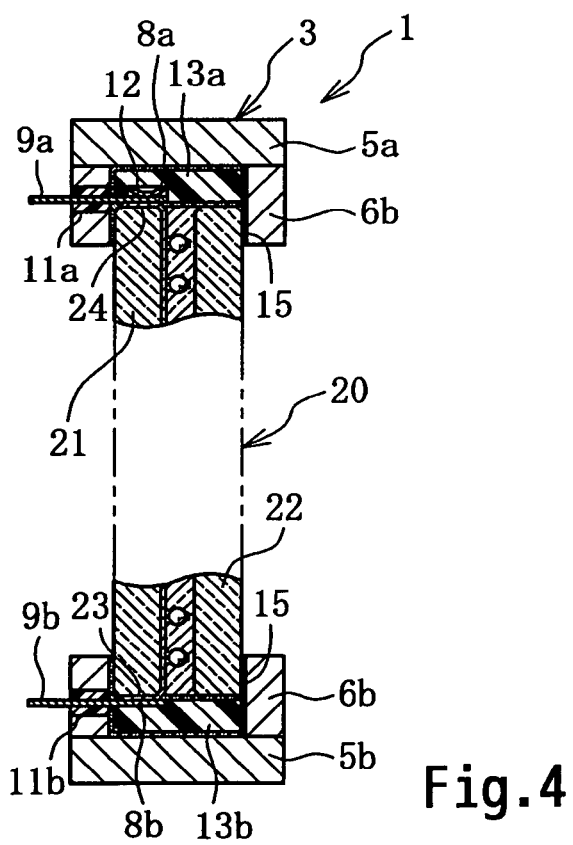
FIG. 4 is a sectional view at IV-IV line of FIG. 1.
Figure 5:
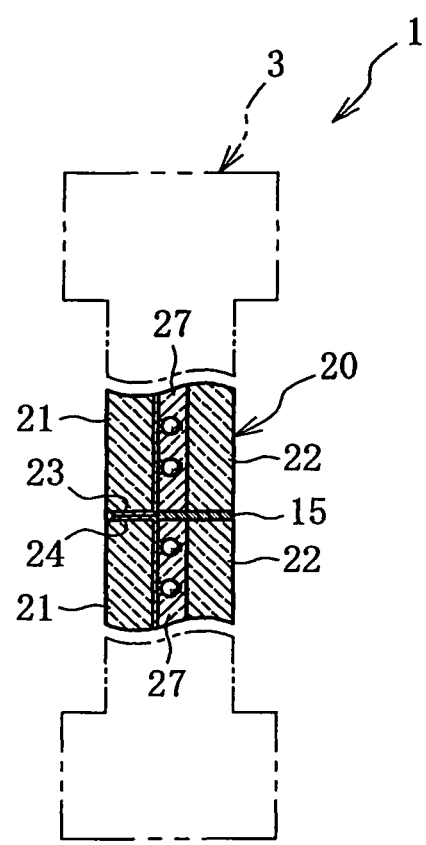
FIG. 5 is a sectional view at V-V line of FIG. 1.

| DESCRIPTION OF NUMERALS | |
|---|---|
| 1 | solar battery panel |
| 3 | external surrounding frame |
| 20, 20A, 20B | see-through type solar battery module |
| 21 | first substrate |
| 22, 22B | second substrate |
| 23 | positive terminal |
| 24 | negative terminal |
| 27 | molding material |
| 29, 29A, 29B | ceramic layer |
| 30, 30A, 30B | cluster |
| 31, 31A, 31B | conductive layer |
| 32, 32A, 32B, 32C | solar cell |
| 33 | layer of spherical semiconductor |
| 34 | flat surface |
| 35 | diffused layer |
| 36 | pn junction |
| 37 | first electrode |
| 38 | second electrode |
| 39 | reflection prevention layer |
| 40, 40A, 40B | bypass diode |
| 48, 48A, 48B | conductive member |
| 50, 50A, 50B | conductive connection member |
| 51, 51A, 51B | elongated conductive layer portion |
| 53, 53A, 53B | conductive connecting piece |
| 55, 55A | conductive layer bridge |

BEST MODE FOR IMPLEMENTING THE INVENTION

In the following, various preferred embodiments for implementation of the present invention will be explained.

Embodiment 1

First, a solar battery panel 1 to which the present invention is applied will be explained.

As shown in FIGS. 1 to 5, the solar battery panel 1 is made as a window material, and is constructed from an external surrounding frame 3 and three see-through type solar battery modules 20. The three see-through type solar battery modules 20 (hereinafter referred to as "modules") are oriented with their long sides horizontal, and are assembled into the external surrounding frame 3 so that they all lie in the same plane and are arranged in a matrix form having three rows and one column.

Sealing material 15 (for example, silicon resin) is charged into the gaps between the modules 20 and the external surrounding frame 3 and into the gaps between vertically adjacent modules, and this serves to prevent ingress of rain or harmful gases into the interior. It should be understood that it is not necessary for the number of the modules 20 to be limited to three; it would also be possible to change the size of the external surrounding frame 3, and to arrange the plurality of modules 20 in a plurality of rows and/or a plurality of columns and then to assemble them into the external surrounding frame.

As shown in FIGS. 1, 3 to 5, the external surrounding frame 3 is made from aluminum, and is made from a pair of upper and lower horizontal frame members 5a, 5b and a pair of left and right vertical frame members 6a, 6b. To the upper horizontal frame member 5a, there are provided a conductive interior terminal 8a that extends along the longitudinal direction of the horizontal frame member 5a, a pair of left and right output terminals 9a that are connected to the two end portions of this interior terminal 8a, insulating members 11a that insulate these output terminals 9a from the external surrounding frame 3, leaf springs 12 that bias the interior terminal 8a downwards, and a backup member 13a that backs up the module 20 from above and moreover insulates the interior terminal 8a from the horizontal frame member 5a.

And to the lower horizontal frame member 5b, there are provided a conductive interior terminal 8b that extends along the longitudinal direction of the horizontal frame member 5b, a pair of left and right output terminals 9b that are connected to the two end portions of this interior terminal 8b, insulating members 11b that insulate these output terminals 9b from the external surrounding frame 3, and a backup member 13b that backs up the module 20 from below and moreover insulates the internal terminal 8b from the horizontal frame member 5b. It should be understood that the raw material from which the external surrounding frame 3 is made is not limited to being aluminum; various other metallic materials could be employed.

The upper and lower output terminals 9a, 9b are long and narrow thin plate shaped members made from metal, and their one end portions are integrally connected to left and right end portions of both of the interior terminals 8a, 8b, while their other end portions are projected outward from the external surrounding frame 3 towards the rear side of the panel 1.

Along with the upper interior terminal 8a being pressed towards a negative terminal 24 of the upper module 20 by the leaf springs 12, a positive terminal 23 of the upper module 20 is pressed towards the negative terminal 24 of the intermediate module 20, and a positive terminal 23 of the intermediate module 20 is pressed towards a negative terminal 24 of the lower module 20, all these terminals thus being reliably electrically connected together. Moreover, by the positive terminal 23 of the lower module 20 being pressed towards the lower interior terminal 8b by the weight of the module 20 itself, a reliable electrical connection is established therebetween. The electrical connections between neighboring modules 20 are established by the upper positive terminal 23 of the upper module 20 being pressed by the weight of the upper module 20 into contact with the negative terminal 24 of the intermediate module 20, and by the positive terminal 23 of the intermediate module being also pressed into contact with the negative terminal 24 of the lower module 20.

Next, only one of the see-through type solar battery modules 20 will be explained, although three modules 20 are provided, since these three modules 20 all have similar constructions.

As shown in FIGS. 6 to 10, this module 20 generates electricity with a plurality of spherical solar cells 32, and comprises an optically transparent first substrate 21, a plurality of annular clusters 30 arranged on this first substrate 21 in a matrix form having a plurality of rows and a plurality of columns, an optically transparent second substrate 22 that is disposed parallel to the first substrate 21 with the plurality of solar cells 32 sandwiched between them, and an optically transparent synthetic resin molding material 27 that is charged between the substrates 21, 22 and is molded into a state in which the plurality of clusters 30 are embedded therein.

Next, the first substrate 21 and the second substrate 22 will be explained. The first substrate 21 is made of a transparent glass plate with the borders chamfered, and may, for example, be processed so that its thickness is 2.8 mm, its height is 210 mm, and its width is 297 mm. The positive terminal 23 (a positive side busbar) is provided at the lower edge portion of the first substrate 21, and has a reversed letter-L cross-sectional shape for external connection, and the negative terminal 24 (a negative side busbar) is provided at the upper edge portion of the first substrate 21, and has a letter-L cross-sectional shape for external connection (refer to FIG. 8). And, similarly to the first substrate 21, the second substrate 22 is made from transparent glass with the borders chamfered, and may, for example, be processed so that its thickness is 2.8 mm, its height is 210 mm, and its width is 297 mm. For the synthetic resin molding material 27 that is charged into the gap between the substrates 21, 22, for example, EVA (ethylene vinyl acetate) resin may be used.

Since the optically transparent synthetic resin molding material 27 is molded and solidified into a state in which the plurality of solar cells 32, a plurality of conductive layers 31, a plurality of bypass diodes 40, and a plurality of conductive connection members 50 all loaded between the substrates 21, 22 are embedded therein. Accordingly it is possible to protect the solar cells 32 and also to strengthen them against vibration and mechanical shock, and moreover it is possible to prevent damage to the module 20 as a whole, so that the safety can be enhanced. Moreover, even if exceptionally the solar cell 32 suffers damage, the broken shards are prevented from flying off or coming away as well as laminated glass which is normally used and wired glass, Now the method for manufacturing this module 20 will be explained in a simple manner. The plurality of clusters 30 are all arranged on the first substrate 21, and then the molding material 27 in sheet form is laid over the plurality of clusters 30, and the second substrate 22 is superimposed thereupon, with the whole being received in a laminator device of a per se known type. This laminator device has a vacuum chamber that is divided horizontally by an elastic membrane. A heater is provided underneath and applies heat to the workpiece via a plate. The workpiece with the second substrate 22 laid over it is placed on the heat application plate, and, while gas is exhausted from the spaces that are horizontally partitioned by the membrane, heat is applied to the molding material 27 to a temperature of around 150° C. so that it becomes melted.

Then, as air is admitted into only the evacuated vacuum chamber above the membrane, the substrates 21, 22 are pressurized from both their sides by the pressure of this admitted air, due to the membrane. And the molding material 27 (i.e. EVA resin) is cooled and solidifies while being held in this state. Due to this thermal melting and solidification the molding material 27, which was a milky white color, becomes transparent, and the plurality of clusters 30 are adhered between the substrates 21, 22, and are sandwiched on both sides by the glass substrates 21, 22 so that an integrated module 20 is completed.

Next, the construction of the clusters 30 will be explained.

Since all of the plurality of clusters 30 have the same structure, only a single cluster 30 will be explained. As shown in FIGS. 2, 6 to 10, the cluster 30 is formed as annular, and comprises a conductive layer 31 that is formed on the first substrate 21, ten solar cells 32, a bypass diode 40, a conductive connecting piece 53 of a conductive connection member 50, and a conductive member 48 that electrically connects together these solar cells 32, the bypass diode 40, and the conductive connecting piece 53.

Next, the conductive layer 31 will be explained.

The conductive layer 31 is formed in an annulus on the inner surface of the first substrate 21, and positive electrodes 37 of the ten solar cells 32, a negative electrode 45 of the bypass diode 40, and the conductive connecting piece 53 are arranged thereupon at regular intervals and are connected thereto by electrically conductive paste 31b. The bypass diode 40 and the conductive connecting piece 53 are arranged between the ten solar cells 32 so as mutually to oppose one another, with a separate conductive layer portion 31a to which the conductive connecting piece 53 is connected being electrically isolated by two slits. This separate conductive layer portion 31a is formed integrally with an elongated conductive layer portion 51 of the conductive connection member 50. It should be understood that the proportion of occupied in the entire area by a light transmission region in which sunlight is not intercepted by the conductive layers 31 is greater than or equal to 50%.

For this conductive layer 31, first, as the foundation for the conductive layer 31, a ceramic paste into which a pigment of a preferred color has been mixed is silk screen printed on the first substrate 21 and is fired, so that a ceramic layer 29 is formed. Next, a silver paste including glass frit is printed on the ceramic layer 29 by a silk screen process, and is fired at 550 to 620° C. so as to form the conductive layer 31. The width of this conductive layer 31 is approximately 2.4 mm, so that it is larger than the diameter of the solar cells 32. It would be acceptable for the thickness to be about 0.25 mm, and, according to the conditions of use, the thickness may be in the range of from 0.01 mm to 0.5 mm. It should be understood that elongated conductive layer portions 51, 51a, and 51b of a conductive connection member 50 and a conductive layer bridge 55 that will be described later are also formed at the same time as the conductive layer 31.

Next, the structure of the spherical solar cells 32 will be explained.

Figure 10:
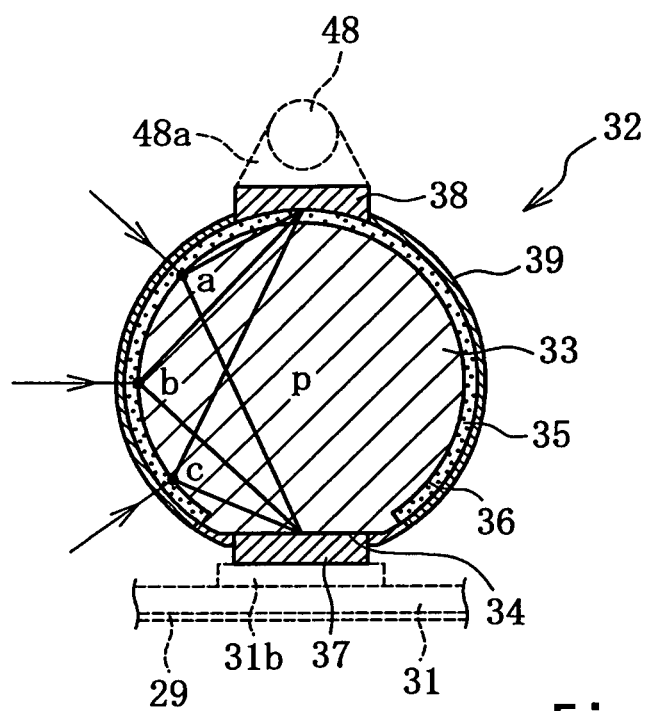
FIG. 10 is a sectional view of a spherical solar cell.

As shown in FIG. 10, a solar cell 32 is mounted with its conducting direction perpendicular to the first substrate 31, and incorporates a spherical p type semiconductor 33, a flat surface 34 that is formed by grinding a portion of the surface of the spherical semiconductor 33, a pn junction 36 shaped as a spherical surface that is defined by an n type diffused layer 35 being formed on the surface layer portion of the spherical semiconductor 33, a pair of positive and negative electrodes 37, 38 (first and second electrodes) that are electrically connected to both ends (both sides) of the pn junction 36 and are formed so as to oppose one another with the center of the spherical semiconductor 33 interposed between them, and a reflection prevention layer 39 that is formed on the entire surface except for the positive and negative electrodes 37, 38. This positive electrode 37 is electrically connected on the conductive surface layer 31 with conductive paste 31b, while the negative electrode 38 is electrically connected to the conductive member 48 with conductive paste 48a.

The method for manufacture of this solar cell 32 will now be explained in a simple manner.

This solar cell 32 is made by a technique of, for example, letting a liquid drop of silicon fall freely so as to solidify partway down into a spherical p type single silicon crystal 33 of diameter approximately 1.6 mm, and by then grinding a portion of its surface to provide the flat surface 34. Then the spherical surface shaped pn junction 36 is created by forming the n type diffused layer 35 by diffusing an n type impurity to a depth of about 0.1 µm inward from the surface, except for the flat surface 34 and a portion of its periphery. It should be understood that it would also be acceptable to create a pn junction by forming a p type diffused layer on a spherical n type single silicon crystal.

Furthermore after forming, as a reflection prevention layer 39, a silicon oxide ($SiO_2$) layer (or, a layer of silicon nitride (SiN)) over the entire spherical surface including the flat surface 34, next a paste including silver is printed in the form of dots on the reflection prevention layer 39, at the apex portions of the flat surface 34 and of the spherical surface. Then, when heat is applied in a gaseous atmosphere up to around 800° C., the silver paste pierces through the reflection prevention layer 39 and contacts against the p type flat surface 34 and the surface of the n type diffused layer 35 with low resistance, and thereby the positive electrode 37 and the negative electrode 38 are provided and the solar cell 32 is completed.

According to this solar cell 32, since as shown in FIG. 10 the pn junction 36 is provided so as to have a spherical surface, accordingly, with the exception of the flat surface 34 and the electrodes 37, 38, the cross sectional area for light reception is always constant irrespective of the angle of incidence of the sunlight, so that a stable output is obtained. Furthermore, since the electrodes 37, 38 are provided as centered on the p type and n type surfaces with the center of the sphere interposed between them, accordingly the sum of the distances connecting from the electrodes 37, 38 to any points a, b, or c on the pn junction 36 is equal, so that the distances through which carriers generated by absorption at the points a, b, or c shift are equal, and the distribution of the flow of electrical current becomes almost equal and the curve fill factor becomes large. Moreover, since the range for light reception is three dimensional and the light other than direct solar illumination, in other words the reflected light and the diffused light, are both received simultaneously, accordingly the level of utilization of peripheral light is also high, so that high output is obtained.

Figure 8:
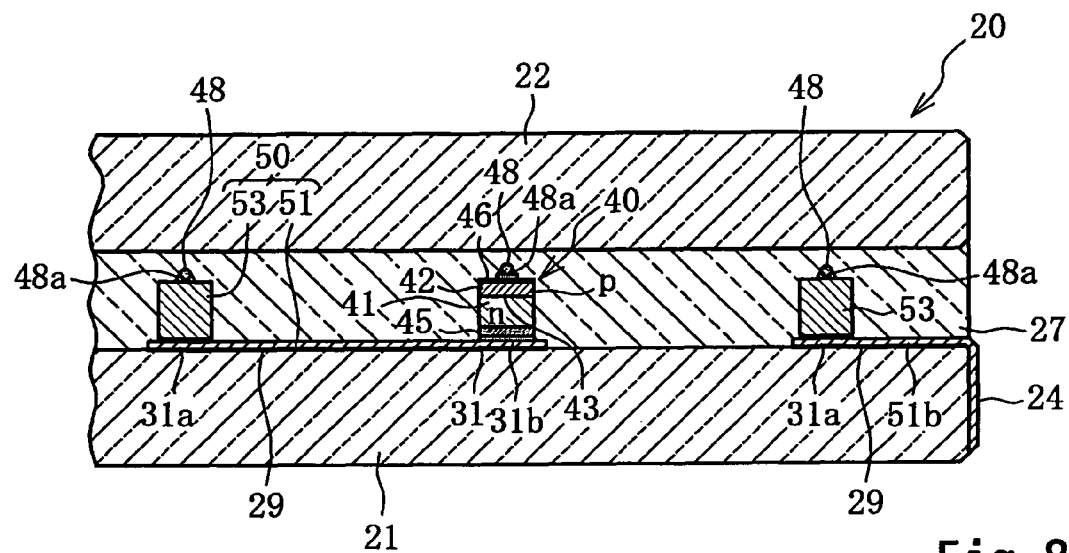
FIG. 8 is a sectional view at VIII-VIII line of FIG. 2.

Next, the bypass diode 40 will be explained. As shown in FIG. 8, the bypass diode 40 is fixed on the first substrate 21 so that its conductive direction lies in the direction orthogonal to the first substrate 21, and is electrically connected to the conductive layers 31 and the conductive member 48 in inverse parallel to the ten solar cells 32. This bypass diode 40 is a circular cylinder and has a height similar to that of the solar cells 32, and is made by forming a pn junction 43 by diffusing a p type impurity into a semiconductor 41, thus making a p type diffused layer 42, and then contacting a negative electrode 45 against the surface of the n type semiconductor 41 and a positive electrode 46 against the surface of the p type diffused layer 42, both with low resistance.

Due to this bypass diode 40, if the ten solar cells 32 within one cluster 30 that are all connected in inverse parallel with the diode 40 are shielded from light so that their functioning stops, even though voltage in the opposite direction originating in the solar cells 32 within the other clusters 30 that are functioning normally (i.e. to generate electricity) is applied to these solar cells 32 in this cluster 30 whose function has stopped, due to this bypass diode 40 bypassing the current, it is possible for the solar cells 32 that are connected in inverse parallel to be protected from destruction or damage, and it is possible to keep the decrease in the output of the entire module 20 due to the shielding from light of a portion including the cluster 30 down to a minimum.

Next, the conductive member 48 will be explained.

Figure 7:
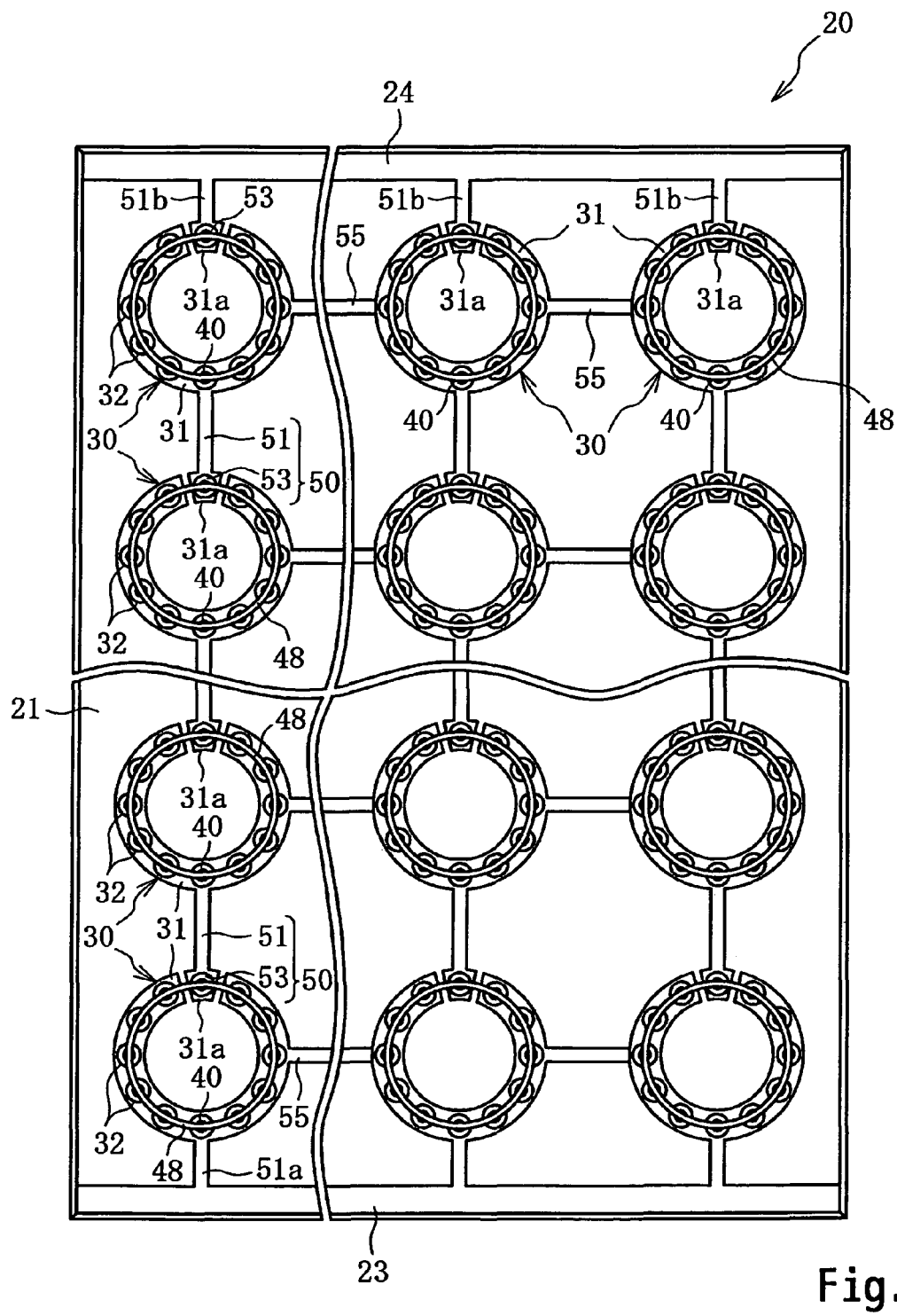
FIG. 7 is an elevation view of the first substrate of FIG. 6 in its state with the conductive members connected on each cluster.
Figure 9:
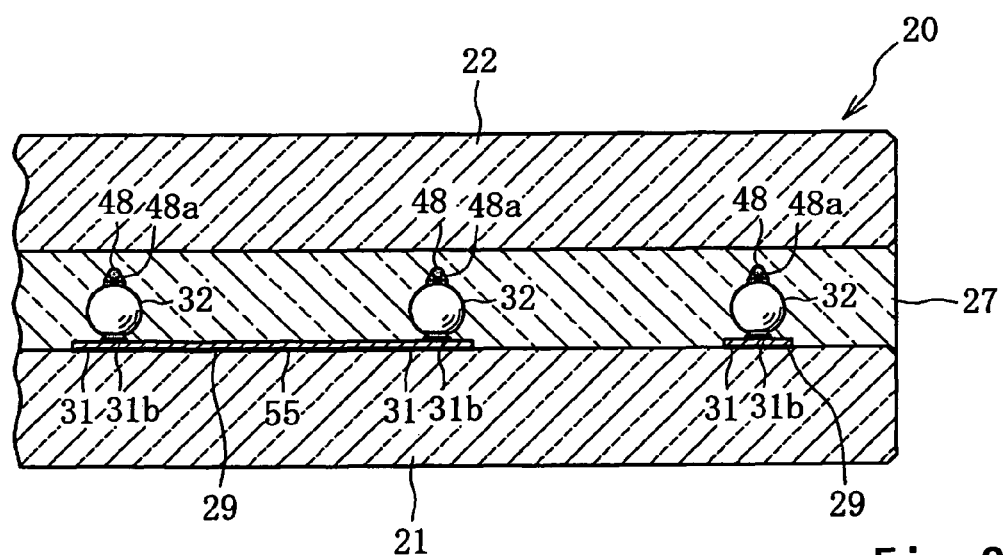
FIG. 9 is an sectional view at IX-IX line of FIG. 2.

As shown in FIGS. 7 to 9, the conductive member 48 is a metallic wire of diameter, for example, 0.3 mm made from copper alloy plated with silver and formed into an annulus, and it is electrically connected with conductive paste 48a to the negative electrodes 38 of the ten solar cells 32, to the positive electrode 46 of the bypass diode 40, and to the conductive connecting piece 53. Via the conductive member 48 and the conductive layer 31, the ten solar cells 32 and the conductive connecting piece 53 are electrically connected in parallel, and the bypass diode 40 is electrically connected to the first substrate 31 and the conductive member 48 in inverse parallel relative to the ten solar cells 32, whereby one of the annular clusters 30 is formed.

Next, a conducting construction by which the plurality of clusters 30 are electrically connected together will be explained.

Figure 6:
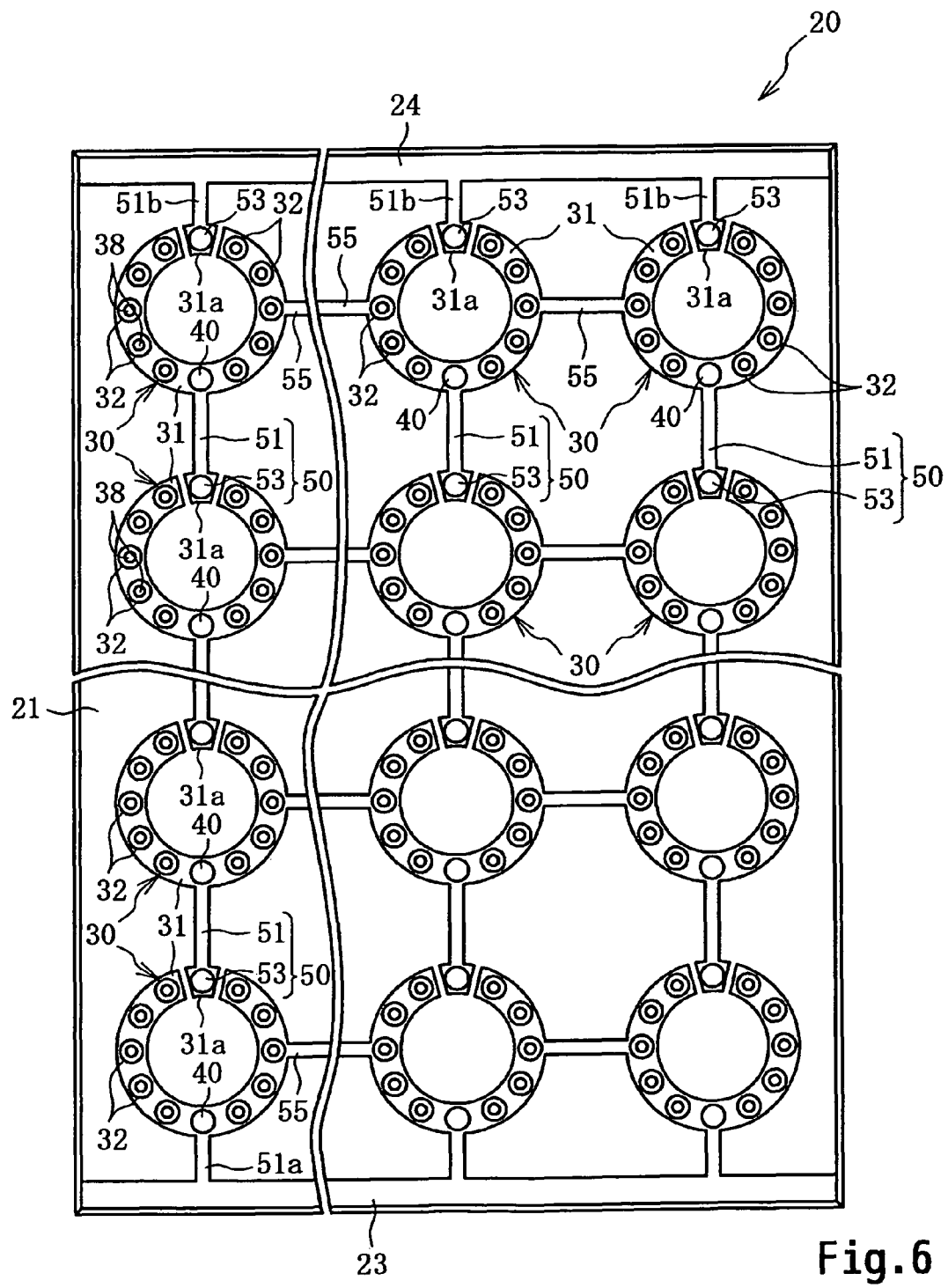
FIG. 6 is an elevation view of a first substrate on which a plurality of clusters are arranged and wired in a matrix configuration having a plurality of rows and a plurality of columns, with certain conductive members removed.

As shown in FIGS. 6, 7, the plurality of clusters 30 are laid out in a matrix form having a plurality of rows and a plurality of columns. The conductive layer 31 of each of the plurality of clusters 30 in each column is electrically connected to the conductive member 48 of the lower side adjacent cluster 30 via the conductive connection member 50. The plurality of conductive layers 31 in the plurality of clusters 30 in each row are electically connected in parallel by conductive layer bridges 55. In other words, among the plurality of clusters 30, the plurality of solar cells 32 of the plurality of cluster groups of each column are connected in series via the conductive connection members 50, and the plurality of solar cells 32 of the plurality of cluster groups of each row are connected in parallel via the conductive layer bridges 55.

The conductive connection member 50 includes a rectilinear elongated conductive layer portion 51 elongated from the conductive layers 31 and the conductive connecting piece 53 connected to the elongated conductive layer portions 51. The conductive connecting piece 53 constitutes a portion of the cluster 30. The elongated conductive layer portion 51 is made from silver paste as well as the conductive layers 31. The conductive connecting piece 53 is a circular cylindrical piece made from metal, and has similar diameter and height to the bypass diode 40. It should be understood that the elongated conductive surface layer portion 51 need not necessarily be rectilinear; it would be acceptable, according to the design, to form to be shaped as zigzags or as curved lines.

The conductive layer bridges 55 are provided so as electrically to connect the plurality of conductive layers 31 of each row. These conductive layer bridges 55 are made from silver paste as well as the conductive layers 31. It should be understood that the conductive layer bridges 55 need not necessarily be rectilinear; it would be acceptable for them to be shaped as zigzags or as curved lines. The conductive layer 31 of the lowermost cluster 30 of each column is connected to the positive terminal 23 via an elongated conductive layer portion 51a, and the separate conductive layer portion 31a of the conductive layer 31 of the uppermost cluster 30 is connected to the negative terminal 24 via an elongated conductive layer portion 51b.

Since the plurality of clusters 30 are connected in series-parallel in this manner, even if some of the clusters 30 have stopped functioning, there is no stopping or decrease of the electricity generation effectiveness of those other clusters 30 that still remain normal, since electrical current still flows through the other clusters by detouring past those clusters 30 whose functioning has stopped, so that it is possible to reduce to a minimum the influence that is exerted to decrease the output of this entire module 20.

Figure 11:
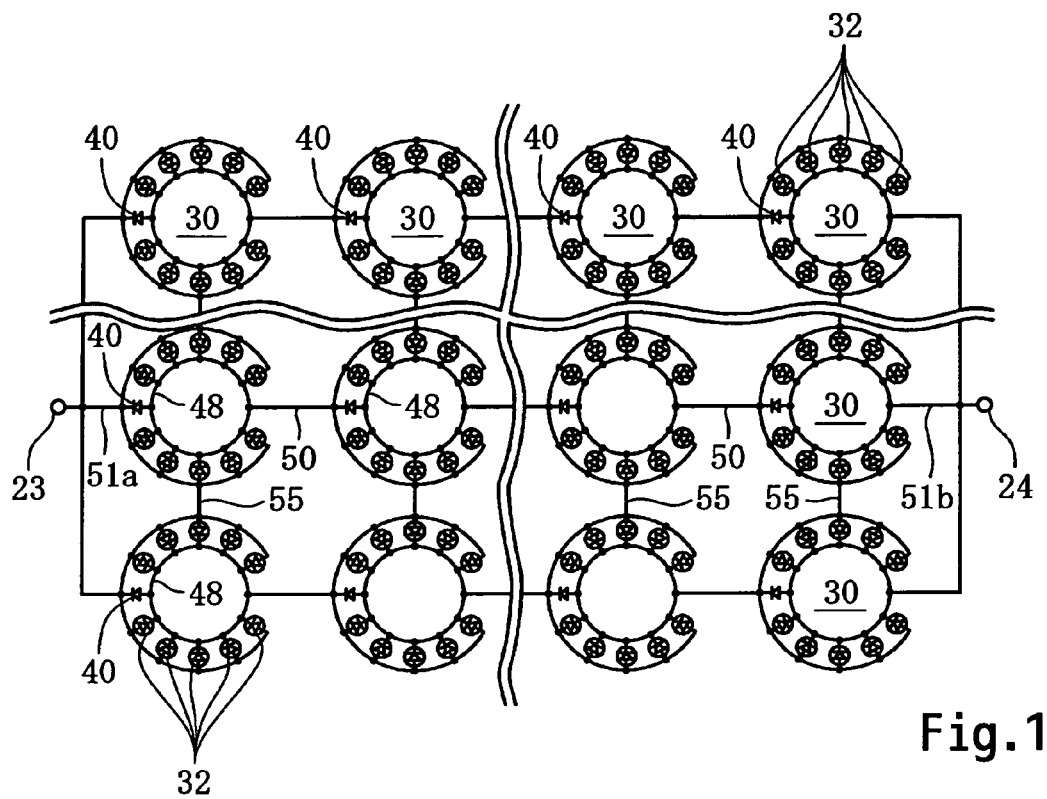
FIG. 11 is an equivalent circuit diagram of the solar battery module.

Next, an equivalent circuit diagram for this module 20 will be explained. FIG. 11 is a drawing showing an equivalent circuit of this module 20 that has a plurality of clusters 30 arranged in a matrix configuration having a plurality of rows and a plurality of columns. However, the row direction is vertical and the column direction is horizontal in FIG. 11.

Here, as an example, the output will be explained of a module in which a plurality of clusters 30 are installed arranged in four rows and three columns. If the open circuit voltage of one solar cell 32 is, for example, 0.6 V, then a voltage of 2.4 V will be generated, since four clusters 30 are connected in series between the positive terminal 23 and the negative terminal 24. And, if the electrical current generated by one solar cell 32 of each cluster of each row is termed I, then 30×I of electrical current will flow from the positive terminal 23, since three clusters 30 in each row are connected in parallel.

In other words, with the solar battery panel 1 to which three of the modules 20 are assembled, a voltage of 7.2 V is generated, and a current of 30×I flows out from the output terminal 9b. It should be understood that it is possible to implement increase of the output voltage of the module 20 by increasing the number of clusters 30 that are connected in series, while, when the output current of the module 20 is to be increased, the number of clusters 30 connected in parallel should be increased. In the same way with the panel 1 as well, if the output voltage is to be increased, then this can be done by increasing the number of modules 20 that are connected in series; whereas, if the output current from the modules 20 is to be increased, then this can be done by increasing the number of modules 20 that are connected in parallel.

Figure 12:
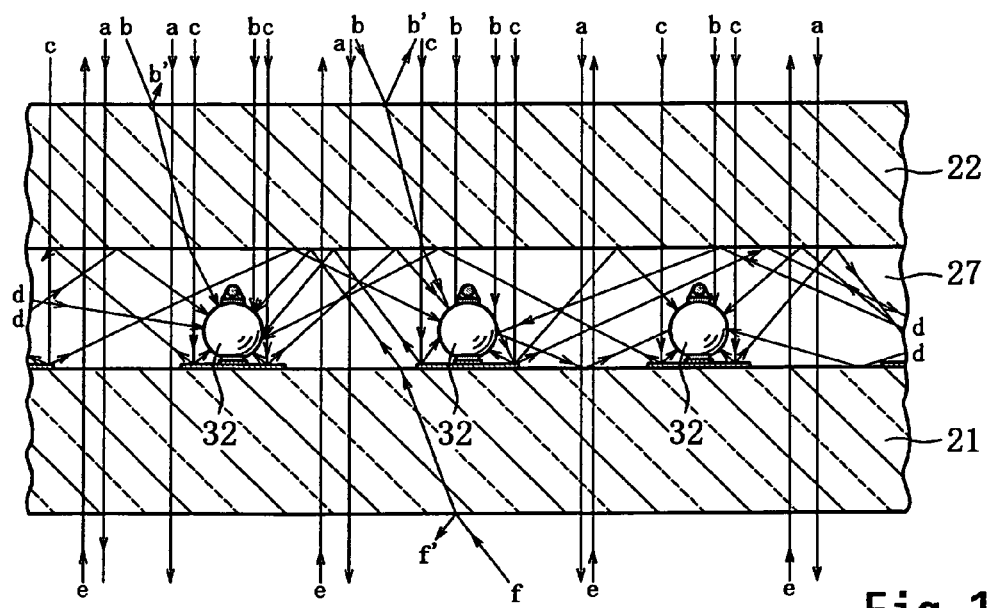
FIG. 12 is an enlarged sectional view showing the behavior of light that is incident onto the solar battery module, the essential portion of the solar battery module.

Next, the behavior of light incident on this module 20 will be explained. FIG. 12 is an enlarged view of a portion of this module 20, for showing the behavior of light incident thereupon. The incident light beams a are light beams that pass through from the second substrate 22 to the first substrate 21, and the incident light beams b are light beams that are directly incident from the second substrate 22 on the solar cell 32, while the incident light beams b' are light beams from the incident beams b that are reflected back by the second substrate 22.

The incident light beams c are light beams that are incident from the second substrate 22 and are reflected by the conductive layers 31 around the solar cells 32 to then be incident on the solar cells 32, the incident light beams d are light beams that are multiply reflected by portions other than the surroundings of the solar cells 32 and are then incident on the solar cells 32, the incident light beams e are beams that pass from the first substrate 21 through the second substrate 22, the incident light beams f are beams that are incident from the first substrate 21 and are reflected by the second substrate 22 to be incident on the solar cells 32, and the incident light beams f are reflected light from the incident light beams f that are reflected by the first substrate 21. In other words, except for the light that passes through the substrates 21, 22 in order to provide indoor lighting (i.e. the transmitted sunlight) which is of course the light that is incident vertically on the substrates 21, 22, the light that is incident in very many other directions can easily be conducted to the solar cells 32, so that it is possible to enhance the efficiency of utilization of the incident light.

In this manner, with this plurality of solar cells 32, it is possible to absorb light that is incident from many directions due to reflection and scattering between the substrates 21, 22, with the exception of the light that is directly incident. In particular, since the conductive layers 31 have high electrical conductivity and high optical reflectivity since they utilize silver, the amount of light that arrives at the solar cells 32 due to internal reflection is increased while the electrical resistance losses due to the wiring are small, so that there is the technical advantages of enhancement of the photoelectromotive force. Moreover, since the solar cells 32 in these clusters 30 are arranged at regular intervals from the centers of circles in a radial manner, accordingly it is possible to minimize the directional dependence of the output of the module 20 on the rotational orientation of its light reception surface around the vertical axis and on the angle of incidence.

Next, the advantages obtained by this see-through type solar battery module 20 will be explained.

According to this module 20, it is possible for light that has been absorbed by the plurality of solar cells 32 to generate electricity, while light which has passed through between the plurality of solar cells 32 (transmitted sunlight) to light the indoors. The ratio of the amount of light that generates electricity to the amount of light that passes through for illumination depends on the projected area of all of the solar cells 3 installed on the first substrate 21. In other words, if it is desired to moderate strong sunlight, then the projected area of all of the solar cells 32 is increased according to the density at which the solar cells 32 are arranged, so that it is possible to increase the amount of electricity that is generated.

According to this module 20, since it is possible to set the pattern in which the plurality of clusters 30 are arranged freely, it is possible to provide the plurality of clusters 30 in patterns of various types, so that the freedom of design becomes high. Moreover, it is also possible to silk screen print a ceramic paste to which pigment of an appropriate color has been added on the surface of the first substrate as a foundation for the above described conductive layers 31, and then to fire this paste to form the ceramic layers 29, thus creating a beautiful and colorful pattern when seen from the inside of the substrate 21 (i.e. from its indoor side). Furthermore, it is possible to make it difficult to see the solar cells 32 or the conductive layers 31 due to the ceramic layers 29. Because of this, it is possible to implement a module whose freedom of design when used as a building material or window material is high, quite apart from its function for optical electricity generation. Moreover, by forming the ceramic layers 29, along with enhancing the adherence to the conductive layers 31, it is also possible to enhance the strength of the glass substrate 21.

According to this module 20, not only are the annular clusters 30 arranged in a matrix configuration that has a plurality of rows and a plurality of columns expressing a geometric design, but also it can be taken advantage of as a window material that can reconcile the needs for generation of electricity from sunlight and also for lighting (i.e. for transmission of sunlight), and the internal diameters and the external diameters of the annular clusters 30 and the gaps between these clusters 30 can be designed in consideration of freedom of design, optical transmittivity, and photoelectric output.

According to this module 20, the wiring provided by the conductive layers 31 and the conductive connection members 50 and the conductive layer bridges 55 has an appropriate width capable of hiding the solar cells 32 as seen from the orthogonal direction to the conductive layer 31, and this is done in order for it to be possible to accentuate the pattern or design of the wiring, so that, along with making it possible to enhance the freedom of design as seen from the rear side of the module 20, it is also possible to increase the amount of the light incident from the front surface that is reflected and received by the solar cells 32, so that the output is enhanced.

According to this module 20, when the sizes of the plurality of solar cells 32 and of the plurality of conductive layers 31 are compared with those of a prior art flat plate type solar cell or a thin layer solar cell, since they are smaller and thinner and also can be arranged in a dispersed configuration, accordingly they do not themselves constitute any hindrance to their own wide field of view, and thus they can be utilized for manufacturing a see-through type solar battery module through which both interior views and exterior scenery can be viewed with uniform lighting (i.e. sunlight transmission) performance and no sense of discomfort.

According to this module 20, by embedding the plurality of solar cells 32 between the optically transparent substrates 21, 22, and by using this module 20 for a window material, it is possible to reduce the total costs in comparison with a case in which electricity is generated using an independent solar battery panel, in which costs are entailed by the cost of materials such as glass or the like, and also for installation. Moreover, since the components such as the plurality of spherical solar cells 32 and the plurality of conductive layers 31 are first arranged, and then the second substrate 22 is laid over them, accordingly it is not necessary to arrange any components on the second substrate 22, so that the assembly process is easy.

Embodiment 2

In this second embodiment, an example is disclosed of a see-through type solar battery module 20A in which the pattern of arrangement of the plurality of spherical solar cells in the plurality of clusters 30 of the first embodiment is changed; and only the structures which are different from those of the first embodiment will be explained.

As shown in FIGS. 13 to 18, these clusters 30A are formed like snowflakes, and each comprises a conductive surface layer 31A formed on the first substrate 21, eleven solar cells 32A, a bypass diode 40A, a conductive connection member 50A, and a conductive member 48A that electrically connects these solar cells 32A, the bypass diode 40A, and the conductive connecting piece 53A. It should be understood that the snowflake configuration in which the cluster 30A is formed is a pattern that includes an inner hexagon shape and an outer hexagon shape that is positioned concentrically on the outside of the inner hexagon shape, and in which the center of the cluster, the six vertices of the inner hexagon shape, and the six vertices of the outer hexagon shape are connected with six radially extending straight lines.

On the first substrate 21, the conductive layer 31A comprises 13 dot-shaped conductive layers 61 that are arranged at the center point, the vertices of the inner hexagon shape, and the vertices of the outer hexagon shape, and linear conductive layers 62 that join the dot-shaped conductive layers 61 from the center of the cluster 30A towards its outside. These dot-shaped conductive surface layers 61 are formed to be of diameter larger than the diameter of the solar cell 32. Among the linear conductive surface layers 62, that linear layer 62 between the dot-shaped conductive surface layer 61 on which the conductive connecting piece 53A is positioned and the dot-shaped conductive layer 61 on which the adjacent solar cell 32A in the center direction is connected is omitted. This detached dot-shaped conductive surface layer 62 is formed integrally with one end portion of the elongated conductive layer portion 51A.

The plurality of solar cells 32A in a cluster 32A include six solar cells 32A that are arranged on the dot-shaped conductive layers 61 at the vertices of the inner hexagon shape and five solar cells 32A that are arranged on the dot-shaped conductive surface layers at vertices of the outer hexagon shape. The bypass diode 40A is positioned on the dot-shaped conductive layer 61 at the central portion of the inner hexagon shape. In other words, the eleven solar cells 32A are connected in parallel, and the bypass diode 40A is connected in inverse parallel with these solar cells 32A. The conductive member 48A is formed in a snowflake configuration so as to correspond to the conductive layers 31A, and the negative electrodes 38 of the solar cells 32A, the positive electrode 46 of the bypass diode 40A, and the conductive connecting piece 53A are electrically connected together via this conductive member 48A.

Next, a conducting construction that electrically connects together the plurality of clusters 30A will be explained.

Figure 13:
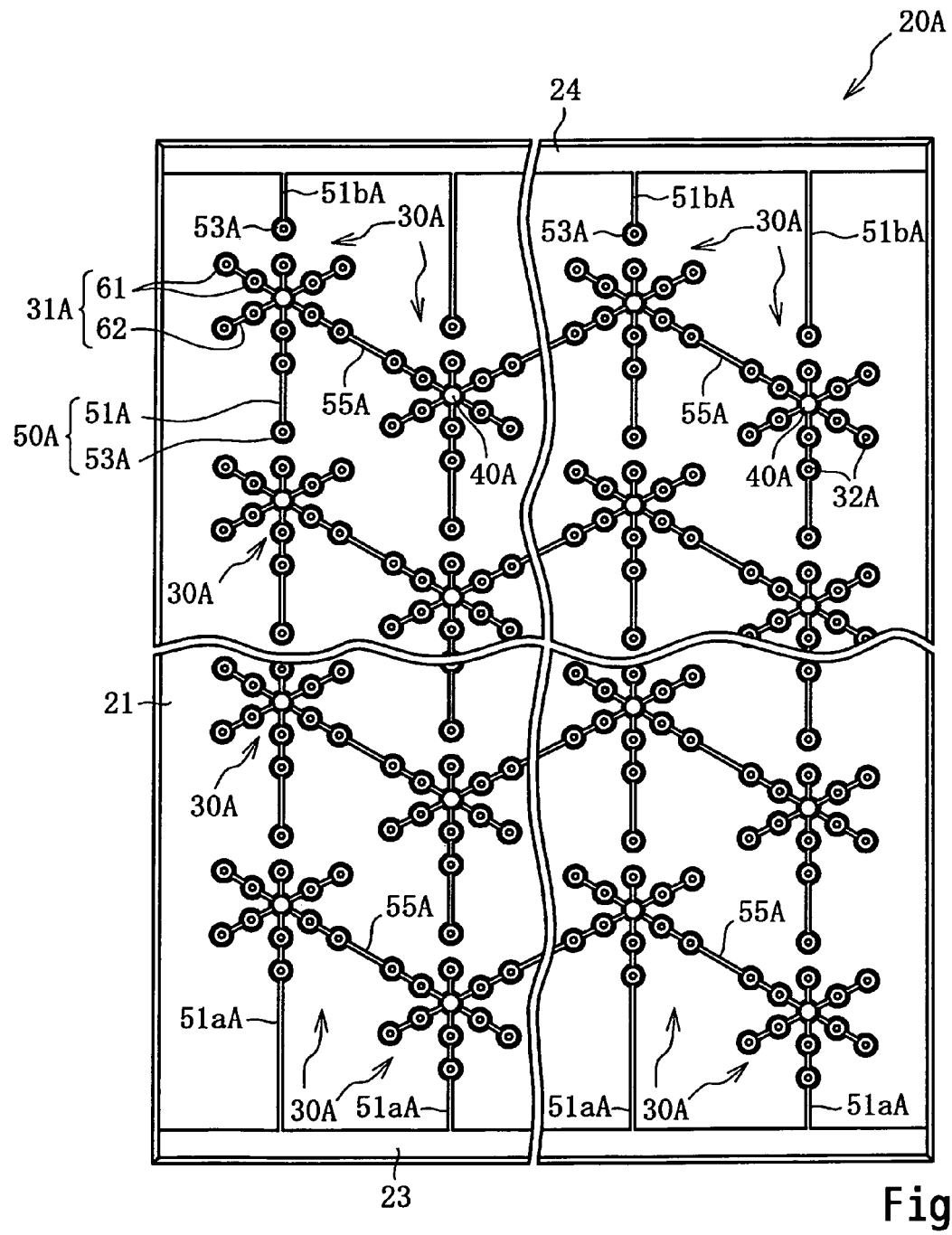
FIG. 13 is an elevation view of a first substrate of a solar battery module according to a second embodiment, on which a plurality of clusters are arranged and wired in a snowflake configuration, with certain conductive members removed.
Figure 14:
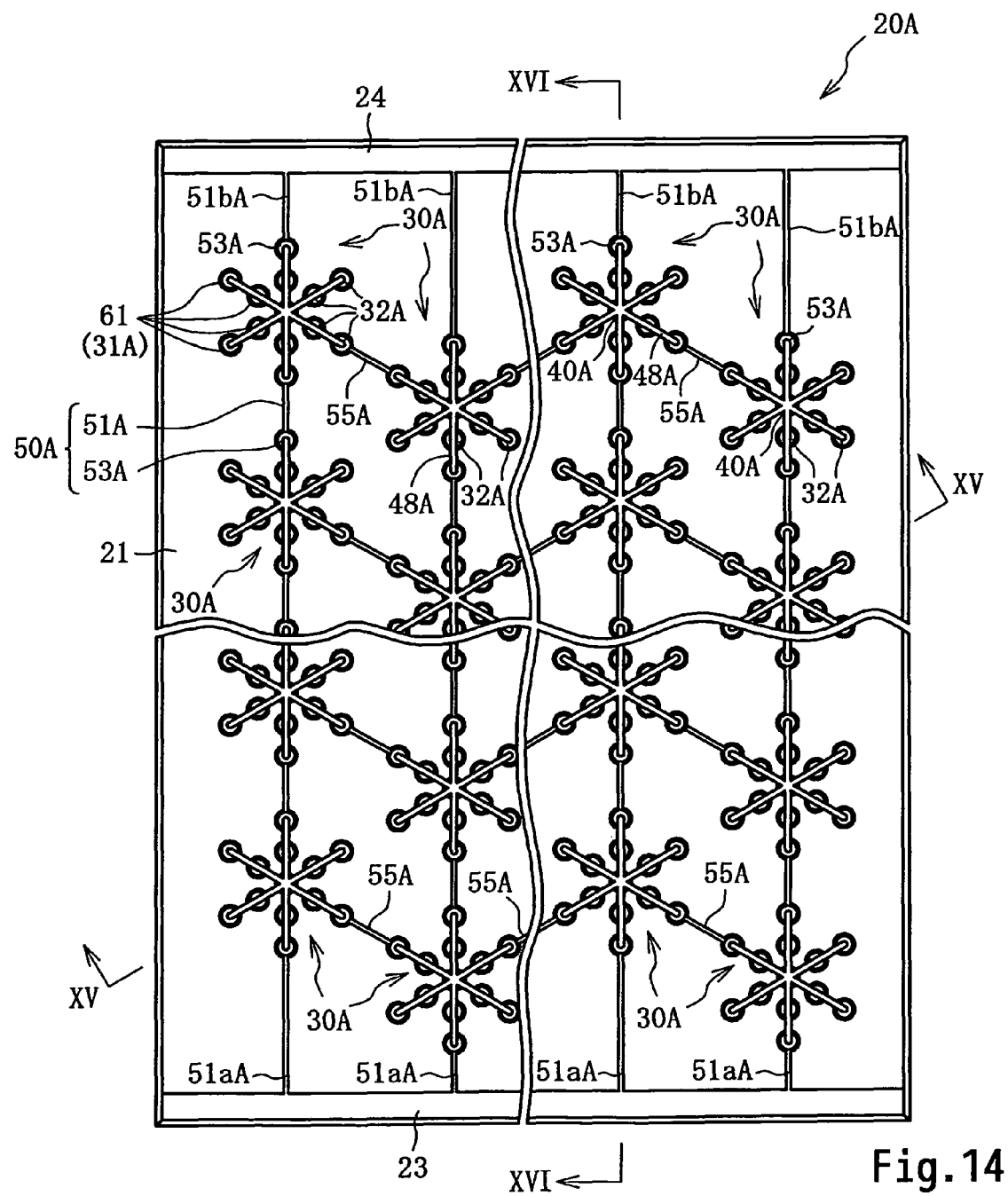
FIG. 14 is an elevation view of the first substrate in its state with the conductive members connected to each cluster of FIG. 13.
Figure 15:
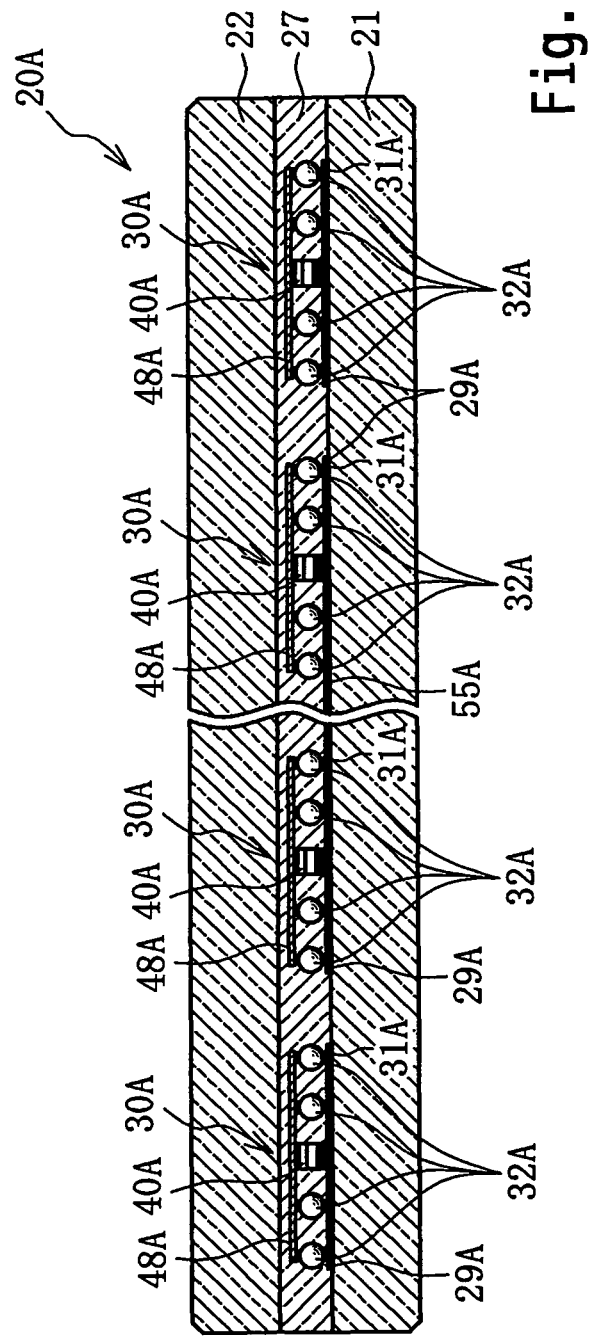
FIG. 15 is a sectional view at XV-XV line of FIG. 14.
Figure 16:
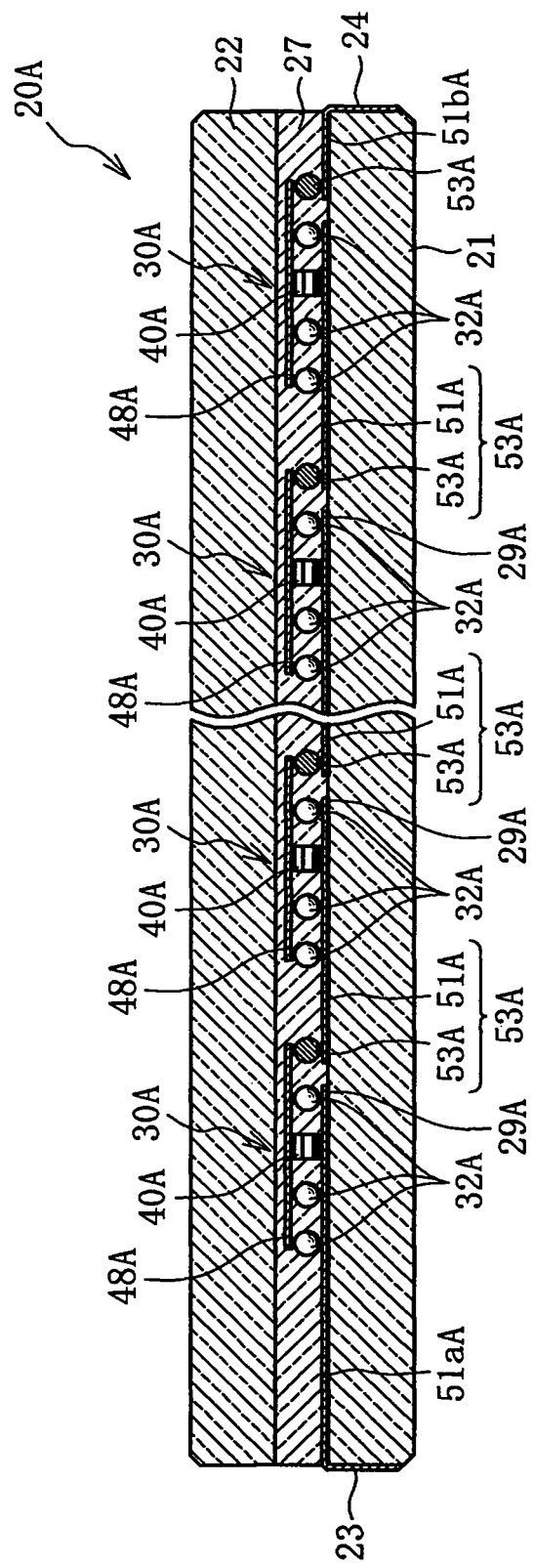
FIG. 16 is a sectional view at XVI-XVI line of FIG. 14.
Figure 17:
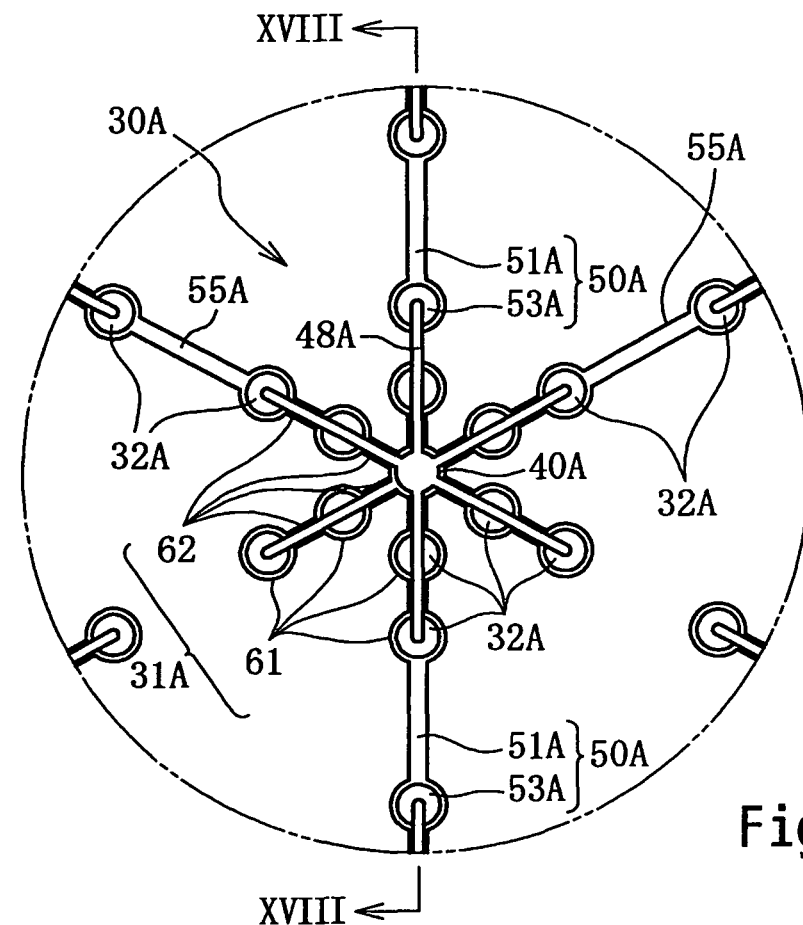
FIG. 17 is an enlarged elevation view of the essential portion of FIG. 14.
Figure 18:
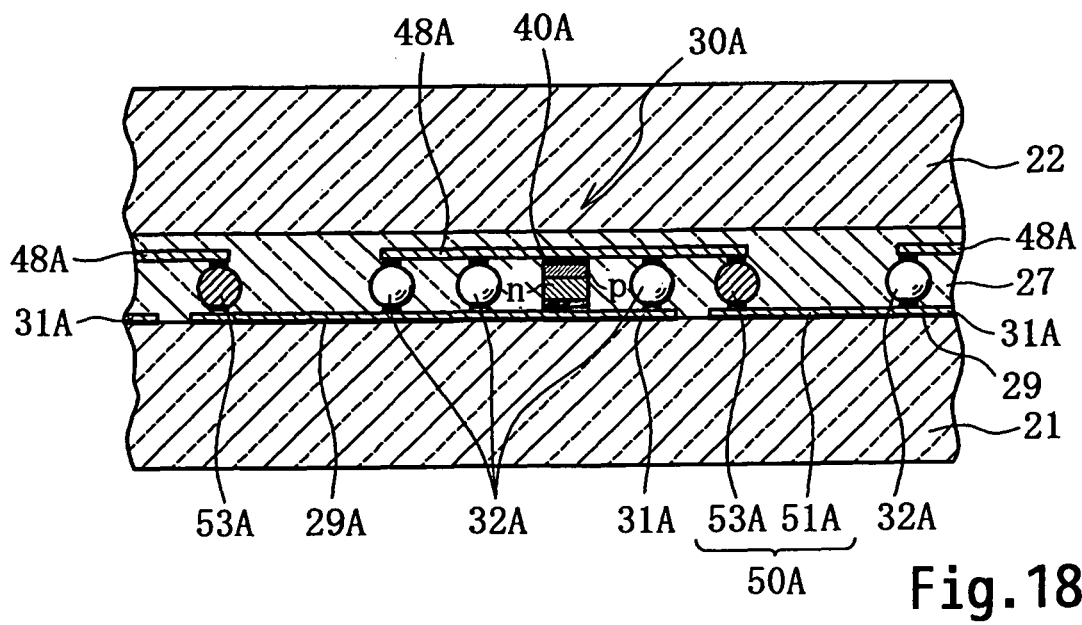
FIG. 18 is a sectional view at XVIII-XVIII line of FIG. 17.
Figure 19:
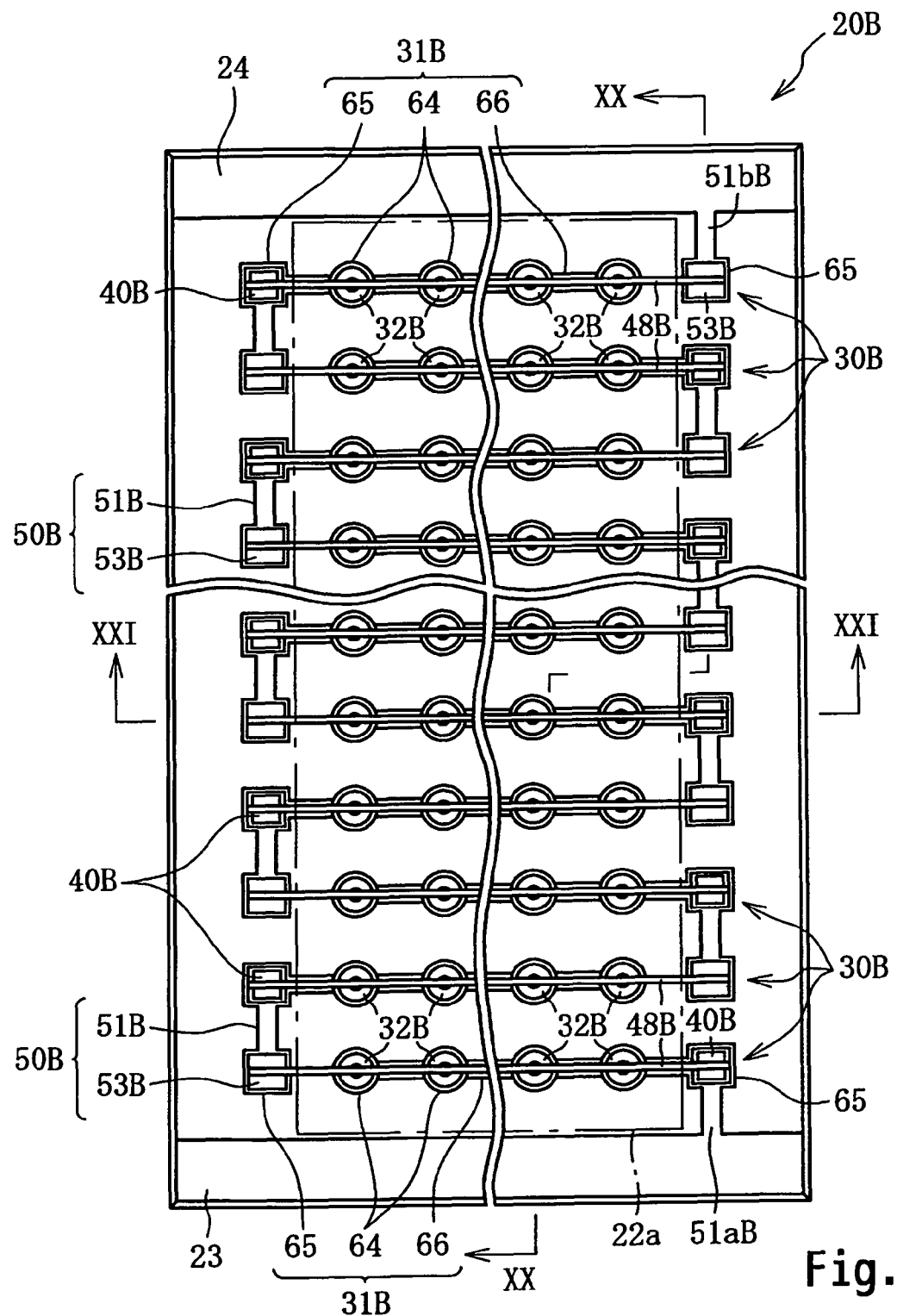
FIG. 19 is an elevation view of a first substrate of a solar battery module according to a third embodiment, on which a plurality of clusters are arranged and wired in a bead curtain configuration.
Figure 20:
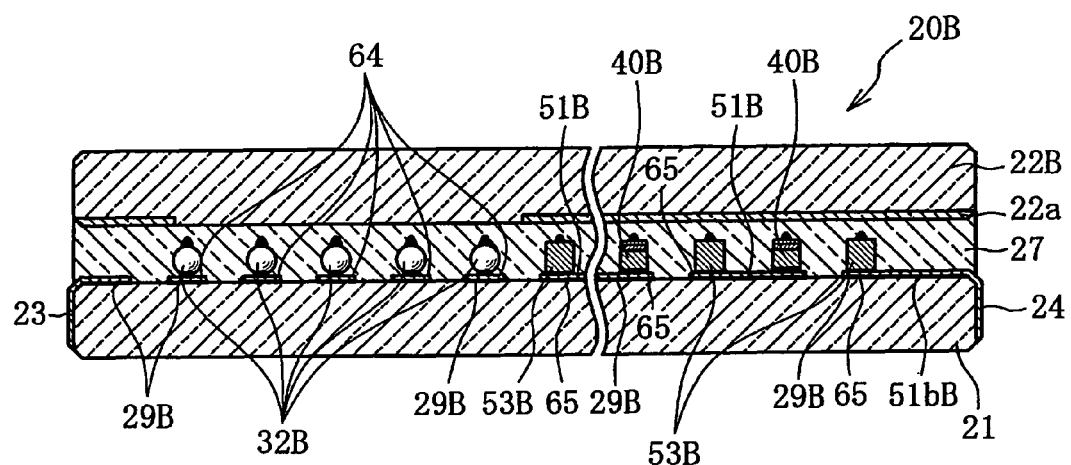
FIG. 20 is a sectional view at XX-XX line of FIG. 19.
Figure 21:
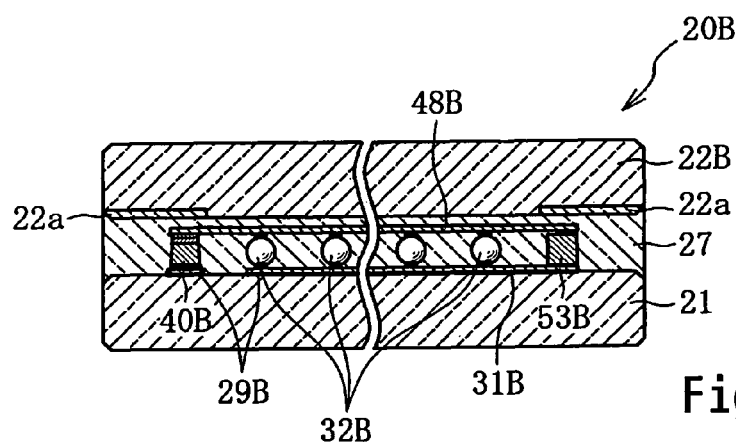
FIG. 21 is a sectional view at XXI-XXI line of FIG. 19.
Figure 22:
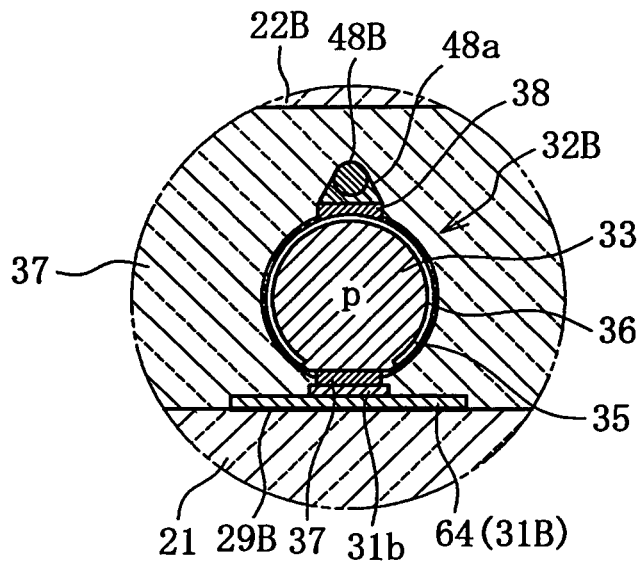
FIG. 22 is an enlarged sectional view of the essential portion of the solar cell of FIG. 20.
Figure 23:
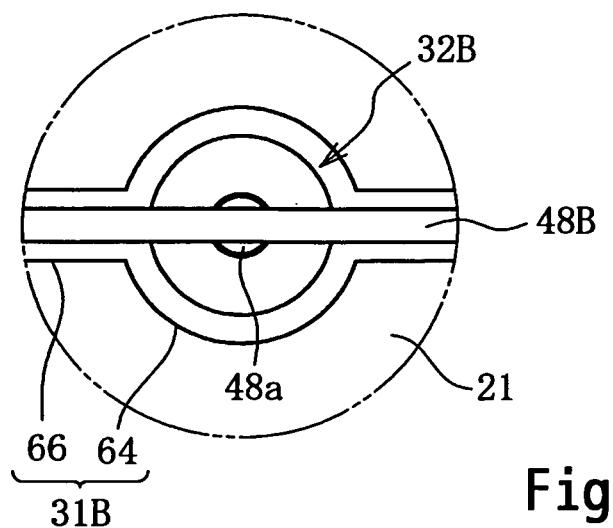
FIG. 23 is an enlarged elevation view of the essential portion of the solar cell of FIG. 19.
Figure 24:
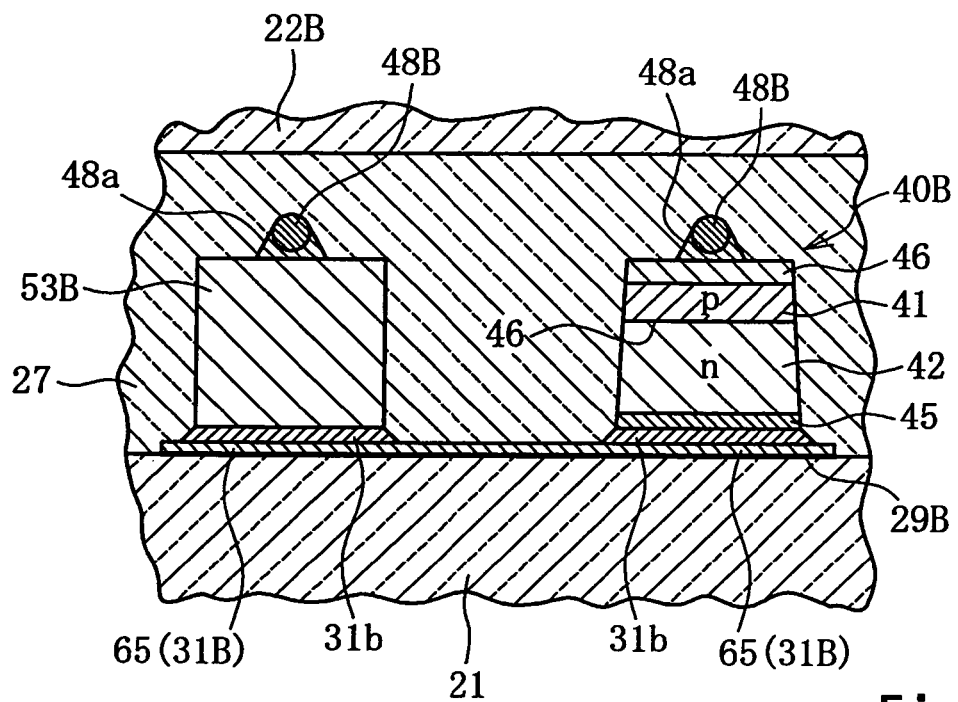
FIG. 24 is an enlarged sectional view of the essential portion of a conductive connecting piece and a bypass diode of FIG. 20.
Figure 25:
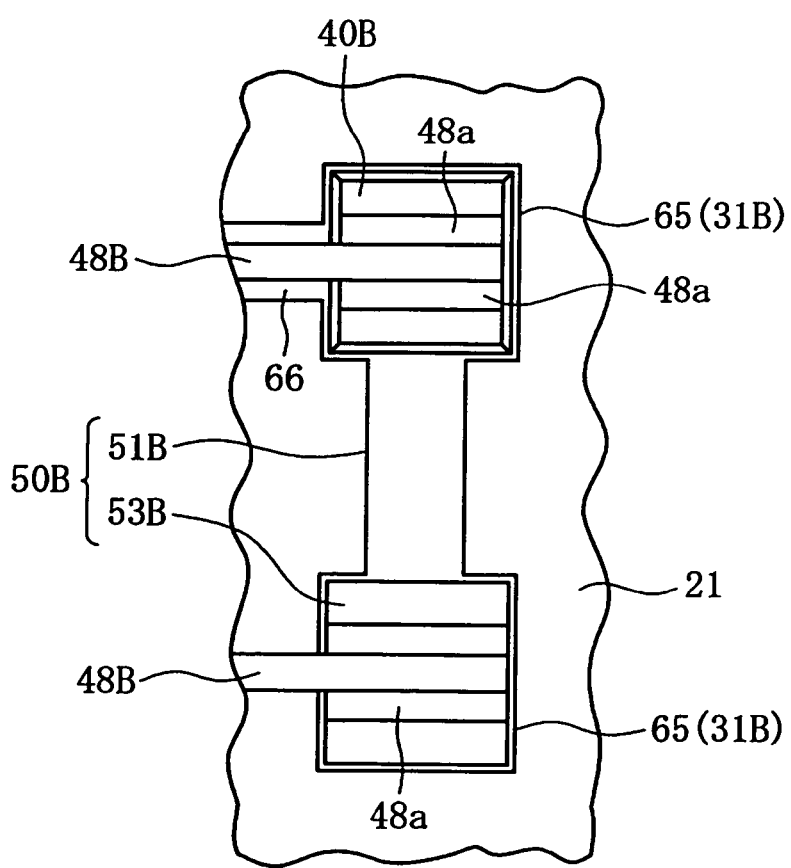
FIG. 25 is an enlarged sectional view of the essential portion of a conductive connecting piece and a bypass diode of FIG. 19.

As shown in FIGS. 13, 14, the plurality of clusters 30A are arranged in a plurality of rows and a plurality of columns so that the central portions of their inner hexagon shapes are positioned on the mesh points of a mesh of equilateral triangles. The conductive layer 31A of each of the plurality of clusters 30A in each column is electrically connected to the conductive member 48A of the lower side adjacent cluster 30A via the conductive connection member 50A.

The plurality of conductive layers 31A of the plurality of clusters 30A arranged along each zigzag row in the direction orthogonal to the column direction being electrically connected in parallel by the conductive layer bridges 55A. The conductive connection member 50A has an elongated conductive layer portion 51A electrically connected to the conductive layer 31A, and a conductive connecting piece 53A that is electrically connected to the one end portion of the elongated conductive layer portion 51A, and the conductive connecting piece 53A is located on a vertex of the outer hexagon shape. The conductive connecting piece 53A is shaped as a sphere made from metal.

Next, the advantages of this module 20A will be explained.

According to this module 20A, since 11 solar cells 32A are arranged as radially extending from the center of the cluster 30A with gaps of 60° between them, accordingly the direction dependence of the output with respect to the light that is incident on the module 20A becomes lower, as compared with the above first embodiment.

Since the clusters 30A along the row direction are arranged in a zigzag configuration, it is possible to reduce the occurrence of the situation in which all of the solar cells 32A that are connected in the same parallel row stop functioning due to a linear shadow, so that solar cells 32A may be provided instead of the bypass diodes 40A, so that it is possible to enhance the output of the module 20A. From the front surface or the rear surface of this module 20A, a pattern like that of a snowflake configuration is seen due to the conductive layers 31A and the conductive members 48A, and this has high freedom of design, and can be employed for a solar battery panel 1 that absorbs light coming from outside that includes sunlight, and that generates electricity with good efficiency. It should be understood that explanation of the other advantages of this embodiment is omitted, since they are the same as in the case of the first embodiment.

Embodiment 3

In this third embodiment, an example is disclosed of a see-through type solar battery module 20B in which the pattern of arrangement of the plurality of spherical solar cells in the plurality of clusters 30 of the first embodiment is changed; and only the structures which are different from those of the first embodiment will be explained.

As shown in FIGS. 19 to 25, these clusters 30B are formed as straight lines extending in the horizontal direction, and one of them comprises a conductive layer 31B formed on the inner surface of the first substrate 21, a plurality of spherical solar cells 32B, a bypass diode 40B, a conductive connecting piece 53B of the conductive connection member 50B, and a conductive member 48B that connects these solar cells 32B, the bypass diode 40B, and the conductive connecting piece 53B together.

The conductive layer 31B is a single straight line, and comprises a plurality of conductive circular layers 64 that correspond to the plurality of solar cells 32B, two square shaped conductive layers 65 that are provided at both end sides of these conductive circular layers 64, and a linear conductive layer 66 that connects together the square shaped conductive layers 65 to the conductive circular layers 64 and also between the conductive circular layers 64, except not between the square shaped conductive layer 65 to which the conductive connecting piece 53B is connected and the adjacent conductive circular layer 64. A plurality of these conductive layers 31B are formed on the first substrate 21, mutually parallel and spaced apart at constant intervals along the vertical direction. It should be understood that the peripheral portion 22a of the inner side of the second substrate 22B is made as frosted glass by roughening its surface by a sandblasting process, and thus is put into a state in which the positive terminal 23 and the negative terminal 24, and the bypass diodes 40B and the conductive connecting pieces 53B, are hard to see from the front surface of the module 20B.

With regard to the plurality of solar cells 32B in each of the clusters 30B, the positive electrodes 37 of the solar cells 32B that are arranged in one straight line are connected on the conductive circular layers 64, and on the one hand the conductive connecting piece 53B is arranged so as to be electrically isolated from the conductive circular layer 64 that corresponds to the square shaped conductive layer 65, while on the other hand the bypass diode 40B is connected so as to be connected in inverse parallel with the solar cells 32B. The conductive member 48B is formed as a single straight line, and the solar cells 32B, the bypass diode 40B, and the conductive connecting piece 53B are electrically connected together via this conductive member 48B.

Next, a conducting construction that electrically connects together the plurality of clusters 30B will be explained.

This plurality of clusters 30B are connected in series from top to bottom via the conductive connection members 50B. The square shaped conductive surface layer 65 on the right side of the uppermost cluster 30B is connected to the negative terminal 24 via an elongated conductive layer portion 51bB, while the square shaped conductive layer 65 on the right side of the lowermost cluster 30B is connected to the positive terminal 23 via an elongated conductive layer portion 51aB.

Next, the advantages of this module 20B will be explained.

With this module 20B, the conductive layers 31B that extend in single straight lines and to which the solar cells 32B are adhered so that the light can pass through are formed so as to be spaced at certain intervals, and accordingly it is possible to determine the sunlight transmission ratio during use as a window material, according to the area of the portion that light can pass through, other than these conductive layers 31B. The pattern created by the conductive layers 31B and the conductive members 48B, in which there is freedom of design, can be seen from the front surface or from the rear surface and moreover it can be utilized for a solar battery panel 1 that absorbs light from the exterior, including sunlight, with good efficiency and generates electricity. It should be understood that explanation of the other advantages of this embodiment is omitted, since they are the same as in the case of the first embodiment.

Embodiment 4

Figure 26:
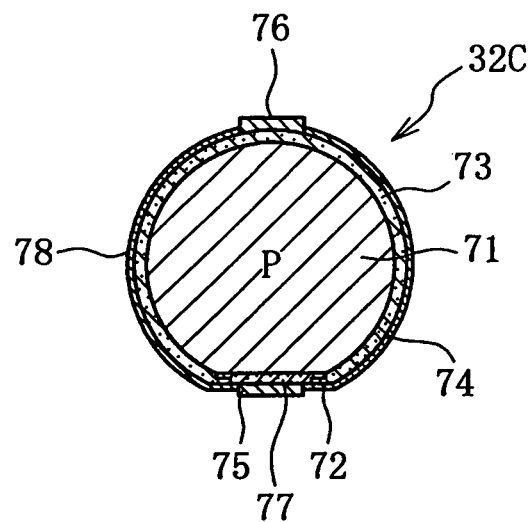
FIG. 26 is a sectional view of a solar cell according to a fourth embodiment.
Figure 27:
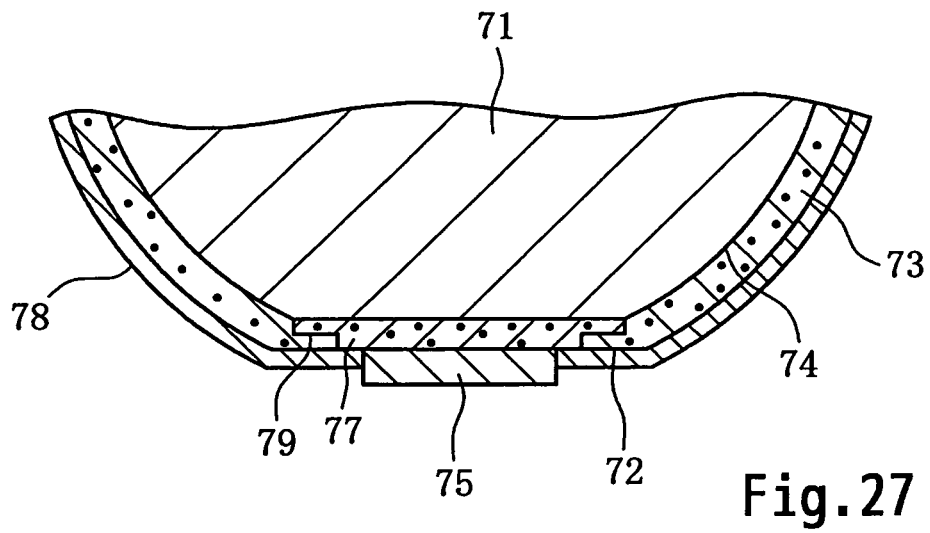
FIG. 27 is an enlarged sectional view of the essential portion of the solar cell.
Figure 28:
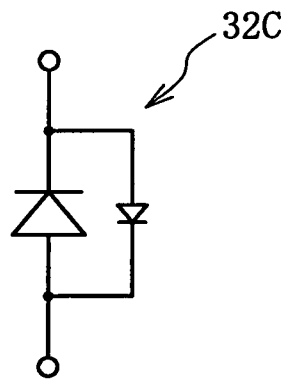
FIG. 28 is an equivalent circuit diagram of the solar cell.

In this fourth embodiment, instead of the spherical solar cells 32, 32A, and 32B of the first through the third embodiment, solar cells 32C of this embodiment may be used. Moreover, in this case, it is possible to replace the bypass diodes with solar cells 32B. As shown in FIGS. 26 to 28, one of these solar cells 32C comprises a spherical p type single silicon crystal 71, a flat surface 72 formed at one end portion of the single silicon crystal 71, an $n^+$ diffused layer 73 formed on the surface portion of the single silicon crystal 71 with the exception of this flat surface 72, a positive electrode 75 and a negative electrode 76 that oppose one another with the center of the single silicon crystal 71 interposed between them, a $p^+$ diffused layer 77 that is formed on an outer surface portion of the flat surface 72 of the single silicon crystal 71 on its side towards the positive electrode 75, and a reflection prevention layer 78 that covers over the surface of the solar cell 32C, with the exception of its portions where the positive electrode 75 and the negative electrode 76 are provided.

A $pn^+$ junction 74 is formed at the surface portion of the single silicon crystal 71, and this functions as a pn junction that is capable of generating photoelectromotive force; and this $pn^+$ junction 74 is formed as a spherical surface that is positioned at a substantially constant depth from the surface of the single silicon crystal 71, except for the flat surface 72. The pair of electrodes 75, 76 are connected at spots to both ends of the $pn^+$ junction 74. And a $p^+n^+$ junction 79 that has a backward diode characteristic due to a tunnel effect is formed in an annulus on the portion towards the single silicon crystal 71 external to and around the positive electrode 75. In other words, the equivalent circuit for this solar cell 32C is as shown in FIG. 28.

According to this module, even if some or all of the solar cells 32C of the clusters of one of the plurality of rows of clusters that are connected in parallel enter into a shadow so that reverse voltage is applied to these solar cells 32C, a bypass electrical current flows via the $p^+n^+$ junctions 79 of the solar cells 32C in this row (refer to FIG. 28). Accordingly, even if a shadow falls in any type of pattern on the module in which the plurality of clusters are electrically connected in a series-parallel circuit in a mesh pattern, there is no loss of generated electrical power, it becomes possible to take it out, and no bad influence is exerted on each of the solar cells. Furthermore, since no bypass diodes are provided, it is possible to increase the number of the solar cells, and thereby to enhance the output of the module.

Next, certain variant embodiments in which the above embodiment is somewhat altered will be explained.

[1] Since the proportion between the output electrical power of this module and its sunlight transmission ratio (or light shielding ratio) depends principally on the output electrical power of the plurality of solar cells that are used and the number thereof that are used, and on the total area shielded from the light by the plurality of conductive layers that are provided on the optically transparent first substrate, accordingly various designs are possible for the arrangement of the plurality of solar cells and the number thereof that are used, corresponding to the pattern or design of the conductive layers on the first substrate, in order further to enhance the high added value and the freedom of design for use as a window material.

[2] Apart from application in the above see-through type solar battery panel, this module can also be applied as a constructional material including a window material that it is desired to use, such as, for example, a glass window, an atrium, a top light, a curtain wall, a façade, a canopy, a louver, a double-skin outer surface, a balustrade for a balcony, a soundproofing wall for a high speed road or railroad, or the like.

INDUSTRIAL APPLICABILITY

With this see-through type solar battery module, by providing the plurality of clusters that include the plurality of spherical solar cells, by configuring these clusters in annular or snowflake configurations or in straight lines, and by arranging the plurality of clusters, it is possible to enhance the permitted scope for selection of the ratio between the sunlight transmission ratio and the electrical generation capability, so that it is possible to obtain higher freedom of design in use as a window material.

The invention claimed is:

1. A see-through type solar battery module for generating electricity with a plurality of spherical solar cells each of which comprises a p type or n type spherical semiconductor, a pn junction formed at a spherical surface layer portion of the spherical semiconductor; and a pair of first and second electrodes that are formed on opposite sides of a center of the spherical semiconductor and are electrically connected to both sides of the pn junction, comprising:

an optically transparent first substrate;

the plurality of spherical solar cells arranged with their conductive directions orthogonal to the first substrate and grouped into a plurality of clusters having a same pattern of arrangement, with the plurality of clusters being arranged in a matrix form having a plurality of rows and a plurality of columns;

a plurality of conductive layers formed on an inner surface of the first substrate, wherein each one conductive layer of the plurality of conductive layers corresponds to one cluster of the plurality of clusters, wherein for each said one cluster the first electrodes of each one solar cell of the plurality of solar cells of said one cluster are connected electrically in parallel to said one conductive layer, respectively;

a plurality of conductive members corresponding to said plurality of clusters, each one conductive member of the plurality of conductive members corresponding to said one cluster of the plurality of clusters, wherein for said each one cluster the second electrode of said each one solar cell of the plurality of solar cells of said one cluster are connected electrically in parallel to said one conductive member, respectively;

wherein the plurality of conductive layers further comprise a first conductive paste in direct physical contact with said plurality of conductive layers;

wherein the plurality of conductive members further comprise a second conductive paste in direct physical contact with said plurality of conductive members;

a plurality of bypass diodes provided corresponding to the plurality of clusters, each one bypass diode of the plurality of bypass diodes corresponds to said one cluster of the plurality of clusters, wherein for each said one cluster said each one bypass diode of the plurality of bypass diodes is electrically connected to and in direct physical contact with the first conductive paste of said one conductive layer of said one cluster and is electrically connected to and in direct physical contact with the second conductive paste of said one conductive member of said one cluster so that said one bypass diode is connected in inverse parallel to said each one solar cell of the plurality of solar cells of each said one cluster;

a plurality of conductive connection members each of which electrically connects the conductive layer of each cluster to the conductive member of an adjacent cluster in a predetermined direction;

a second optically transparent substrate disposed parallel to the first substrate with the plurality of solar cells sandwiched between them, and with the plurality of conductive members being arranged between the first substrate and second substrate; and an optically transparent synthetic resin molding material that is charged between the first and second substrates and embeds the plurality of solar cells, the plurality of conductive members, and the plurality of conductive connection members therein.

2. A see-through type solar battery module according to claim 1, wherein a positive terminal of the see-through type solar battery module is provided at one end portion of the first substrate, and a negative terminal of the see-through type solar battery module is provided at another end portion of the first substrate.

3. A see-through type solar battery module according to claim 1, wherein the solar cell has a bypass function of bypassing reverse current.

4. A see-through type solar battery module according to claim 1, wherein the conductive connection member has an elongated conductive layer portion elongated from the conductive layer, and a conductive connecting piece that is electrically connected to an end portion of the elongated conductive layer portion; and the plurality of solar cells, the conductive connecting piece, and the bypass diode in each of the clusters are disposed in an annulus, with the plurality of clusters being arranged in a matrix form having a plurality of rows and a plurality of columns.

5. A see-through type solar battery module according to claim 4, wherein the plurality of solar cells of each of the plurality of clusters of each row or each column are connected in series via the conductive connection members, and conductive layer bridges are provided that electrically connect a plurality of conductive layers of a plurality of columns or each of the plurality of rows.

6. A see-through type solar battery module according to claim 1, wherein the plurality of solar cells in each cluster include six solar cells arranged at vertices of an inner hexagon shape and five solar cells arranged at vertices of an outer hexagon shape that is outside the inner hexagon shape.

7. A see-through type solar battery module according to claim 6, wherein the conductive connection member includes an elongated conductive layer portion elongated from the conductive layer and a conductive connecting piece that is electrically connected to an end portion of the elongated conductive layer portion, and the conductive connecting piece is disposed at a vertex of the outer hexagon shape; and the bypass diode is disposed at a central portion of the inner hexagon shape.

8. A see-through type solar battery module according to claim 6, wherein the plurality of clusters are arranged in a plurality of rows and a plurality of columns, so that central portions of the inner hexagon shapes are positioned at mesh points of a mesh of equilateral triangles.

9. A see-through type solar battery module according to claim 8, wherein conductive layer bridges are provided that electrically connect the plurality of conductive layers of the plurality of clusters in zigzag lines in a direction that is orthogonal to the row direction or the column direction of the plurality of rows and the plurality of columns.

10. A see-through type solar battery module according to claim 1, wherein the plurality of solar cells in each cluster are arranged on one straight line.

11. A see-through type solar battery module according to claim 1, wherein the first and second substrates are made of transparent glass plates.

12. A see-through type solar battery module according to claim 1, wherein a proportion occupied in the entire area by a light transmission region in which sunlight is not intercepted by the conductive layers is greater than or equal to 50%.

13. A see-through type solar battery module according to claim 1, wherein a plurality of the see-through type solar battery modules are arranged in a plurality of rows or in a plurality of columns by being fitted into an external surrounding frame made from metal.

14. A see-through type solar battery module according to claim 1, wherein a ceramic layer, with added color and patterned, is provided as a foundation for the plurality of conductive layers.

* * * * *